US012591409B2

(12) United States Patent
Zhang et al.

(10) Patent No.: US 12,591,409 B2
(45) Date of Patent: *Mar. 31, 2026

(54) CONVERTER FOR CONVERTING DATA TYPE, CHIP, ELECTRONIC DEVICE, AND METHOD THEREFOR

(71) Applicant: Anhui Cambricon Information Technology Co., Ltd., Hefei (CN)

(72) Inventors: Yao Zhang, Hefei (CN); Shaoli Liu, Hefei (CN)

(73) Assignee: ANHUI CAMBRICON INFORMATION TECHNOLOGY CO., LTD., Hefei (CN)

( * ) Notice: Subject to any disclaimer, the term of this patent is extended or adjusted under 35 U.S.C. 154(b) by 1011 days.

This patent is subject to a terminal disclaimer.

(21) Appl. No.: 17/620,562

(22) PCT Filed: Oct. 22, 2020

(86) PCT No.: PCT/CN2020/122948

§ 371 (c)(1),
(2) Date: Jun. 28, 2022

(87) PCT Pub. No.: WO2021/078209

PCT Pub. Date: Apr. 29, 2021

(65) Prior Publication Data

US 2022/0326947 A1 Oct. 13, 2022

(30) Foreign Application Priority Data

Oct. 25, 2019 (CN) ......................... 201911024613.8

(51) Int. Cl.

| | |
|---|---|
| ***G06F 7/483*** | (2006.01) |
| ***G06F 9/30*** | (2018.01) |
| ***H03M 7/24*** | (2006.01) |

(52) U.S. Cl.
CPC .......... *G06F 7/483* (2013.01); *G06F 9/30025* (2013.01); *H03M 7/24* (2013.01)

(58) Field of Classification Search
CPC ... G06F 7/483; G06F 5/01; G06F 9/30; G06F 9/30025
See application file for complete search history.

(56) References Cited

U.S. PATENT DOCUMENTS

2008/0270498 A1* 10/2008 Lundvall ............. G06F 9/30025 708/204
2008/0307029 A1* 12/2008 Kan ........................ G06F 7/483 708/503

(Continued)

FOREIGN PATENT DOCUMENTS

| | | |
|---|---|---|
| CN | 101930355 A | 12/2010 |
| CN | 102122240 A | 7/2011 |
| CN | 108055041 A | 5/2018 |

OTHER PUBLICATIONS

Feng et al., “A Data-type Converting Circuit Unit And Device” is a Machine Translation of CN 108055041 A, May 5, 2018 (Year: 2018).*

(Continued)

*Primary Examiner* — Carlo Waje
(74) *Attorney, Agent, or Firm* — Getech Law LLC; Jun Ye

(57) ABSTRACT

A converter for data type conversion includes a first conversion stage and a second conversion stage. The first conversion stage is configured to receive first type data and first descriptive information about the first type data, and according to the first descriptive information, convert the first type data into an intermediate result. The second conversion stage is configured to receive second descriptive information about second type data, and according to the second descriptive information, convert the intermediate (Continued)

result into the second type data. A method for data type conversion includes: receiving first type data and first descriptive information about the first type data, and according to the first descriptive information, converting the first type data into an intermediate result; and receiving second descriptive information about second type data, and according to the second descriptive information, converting the intermediate result into the second type data.

17 Claims, 17 Drawing Sheets

(56) References Cited

U.S. PATENT DOCUMENTS

| | | | | |
|---|---|---|---|---|
| 2012/0124115 | A1* | 5/2012 | Ollmann | G06F 9/30025 708/204 |
| 2016/0092168 | A1* | 3/2016 | Lutz | H03M 7/24 708/204 |

OTHER PUBLICATIONS

PCT/CN2020/122948—International Search Report and Written Opinion, mailed on Jan. 22, 2021, 17 pages.

* cited by examiner

First type data

Sign bit calculation circuit E11

Intermediate sign bit MSign

First exponent bit

Significant bit calculation circuit E12

Intermediate data bit Mdata

Intermediate exponent bit calculation circuit E13

Intermediate exponent bit Mshift

First extracting unit E1

CONVERTER FOR CONVERTING DATA TYPE, CHIP, ELECTRONIC DEVICE, AND METHOD THEREFOR

CROSS REFERENCE OF RELATED APPLICATION

This is a 371 of International Application No. PCT/CN2020/122948, filed Oct. 22, 2020, which claims priority to: Chinese Patent Application No. 201911024613.8 with the title of "Converter for Converting Data Type, Chip, Electronic Device, and Method Therefor" filed on Oct. 25, 2019. The content of the aforementioned applications is are herein incorporated by reference in its their entirety.

TECHNICAL FIELD

The present disclosure relates to the technical filed of data processing and more specifically relates to data type conversion.

BACKGROUND

For a traditional computation unit, when an instruction (a computation unit) is implemented, there is generally only a mutual conversion between a fixed-precision floating-point number and an integer number, and a data conversion function is single. While in an artificial intelligence chip, the number of data type conversion instructions ("conversion number" for short) that are performed is greater than that of a traditional processing unit, and a requirement of computer programmers for the function of data type conversion has increased significantly. Therefore, a larger number of software calculations may make weaknesses such as low computation efficiency, large memory access overheads, high calculation power consumption of data type conversion implemented through software become more prominent, and a computation speed may become a performance bottleneck of an entire processor core.

Simultaneously, a traditional computation unit implemented through the instruction is implemented with a single function, and if the processor core is required to implement a new data type conversion function, according to the added new function, a logic expression (such as a logic expression function and a logic expression circuit) is required to be added according to a multiplication principle. As such, scalability of the traditional computation unit is poor. Once a new function requirement appears, the area of the computation unit in the chip may be increased multiple times, and there may be a lot of repeated calculation logic, which may affect overall performance of the processor.

For example, if there are M types of input data and N types of output data, there are M*N commonly-needed data conversion paths. Therefore, a corresponding circuit design may become relatively complex, and power consumption may become relatively high, and every time a new data type appears, a converter may be required to be redesigned, which may increase workloads and reduce production efficiency.

Therefore, a traditional method for the data type conversion performs poorly in the artificial intelligence chip, and a traditional implementation method may not be referred to implement the computation unit in the artificial intelligence chip.

SUMMARY

One purpose of the present disclosure is to overcome the deficit of low data conversion efficiency and poor scalability in existing technologies.

A first aspect of the present disclosure provides a converter for data type conversion, comprising: a first conversion stage L1 configured to receive first type data and first descriptive information about the first type data, and according to the first descriptive information, convert the first type data into an intermediate result; and a second conversion stage L2 configured to receive second descriptive information about second type data, and according the second descriptive information, convert the intermediate result into the second type data.

A second aspect of the present disclosure provides a chip including the converter above.

A third aspect of the present disclosure provides an electronic device including the chip above.

A fourth aspect of the present disclosure provides a method for data type conversion, comprising: receiving first type data and first descriptive information about the first type data, and according to the first descriptive information, converting the first type data into an intermediate result; and receiving second descriptive information about second type data, and according to the second descriptive information, converting the intermediate result into the second type data.

A fifth aspect of the present disclosure provides an electronic device, comprising: one or more processors; and a memory, where the memory stores computer-executable instructions, and when the computer-executable instructions are executed by the one or more processors, the electronic device performs the above-mentioned method.

A sixth aspect of the present disclosure provides a computer-readable storage medium, including computer-executable instructions, where when the computer-executable instructions are executed by one or more processors, the above-mentioned method is performed.

At least one of beneficial effects of a technical solution of the present disclosure lies in improving efficiency of data type conversion in the artificial intelligence chip, reducing computation loads, and decreasing circuit areas required.

BRIEF DESCRIPTION OF THE DRAWINGS

By reading the following detailed description with reference to drawings, the above and other objects, features and technical effects of exemplary embodiments of the present disclosure will become easier to understand. In the drawings, several embodiments of the present disclosure are shown in an exemplary but not restrictive manner, and the same or corresponding reference numerals indicate the same or corresponding parts of the embodiments.

FIG. **7*a* shows a schematic block diagram of a second calculation unit C2** according to an implementation of the present disclosure.

Figure 7A:
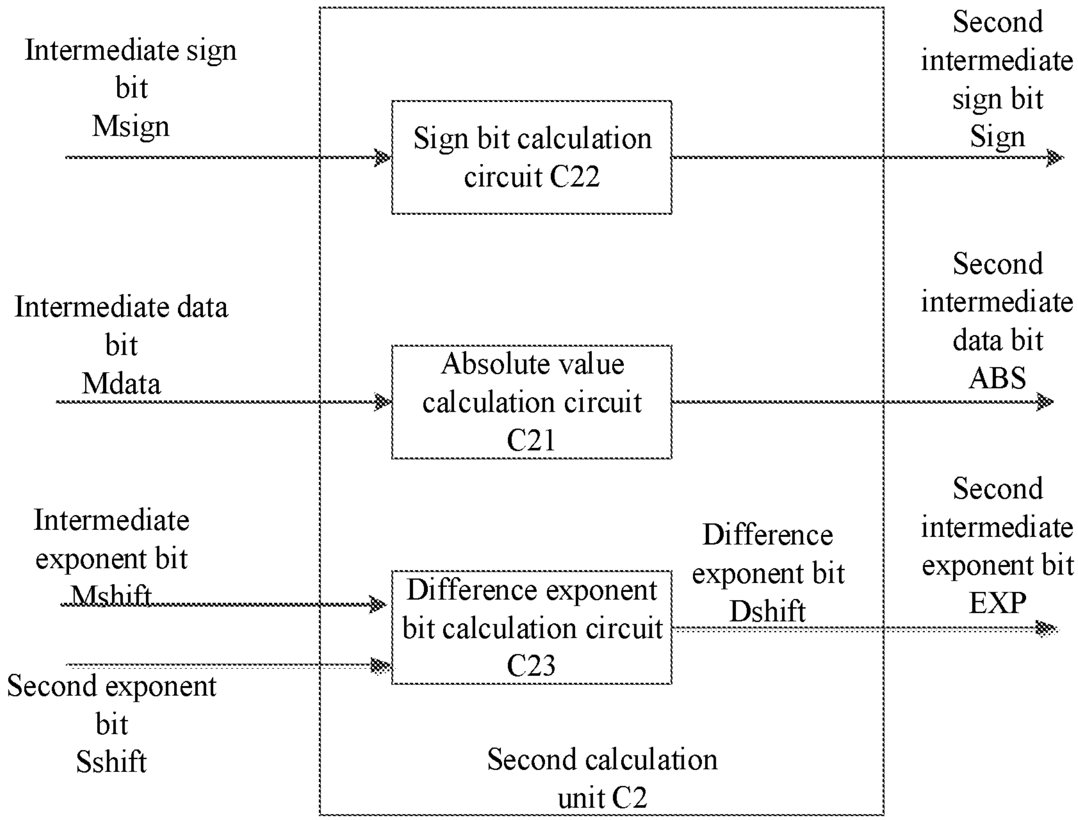
Figure 7B:
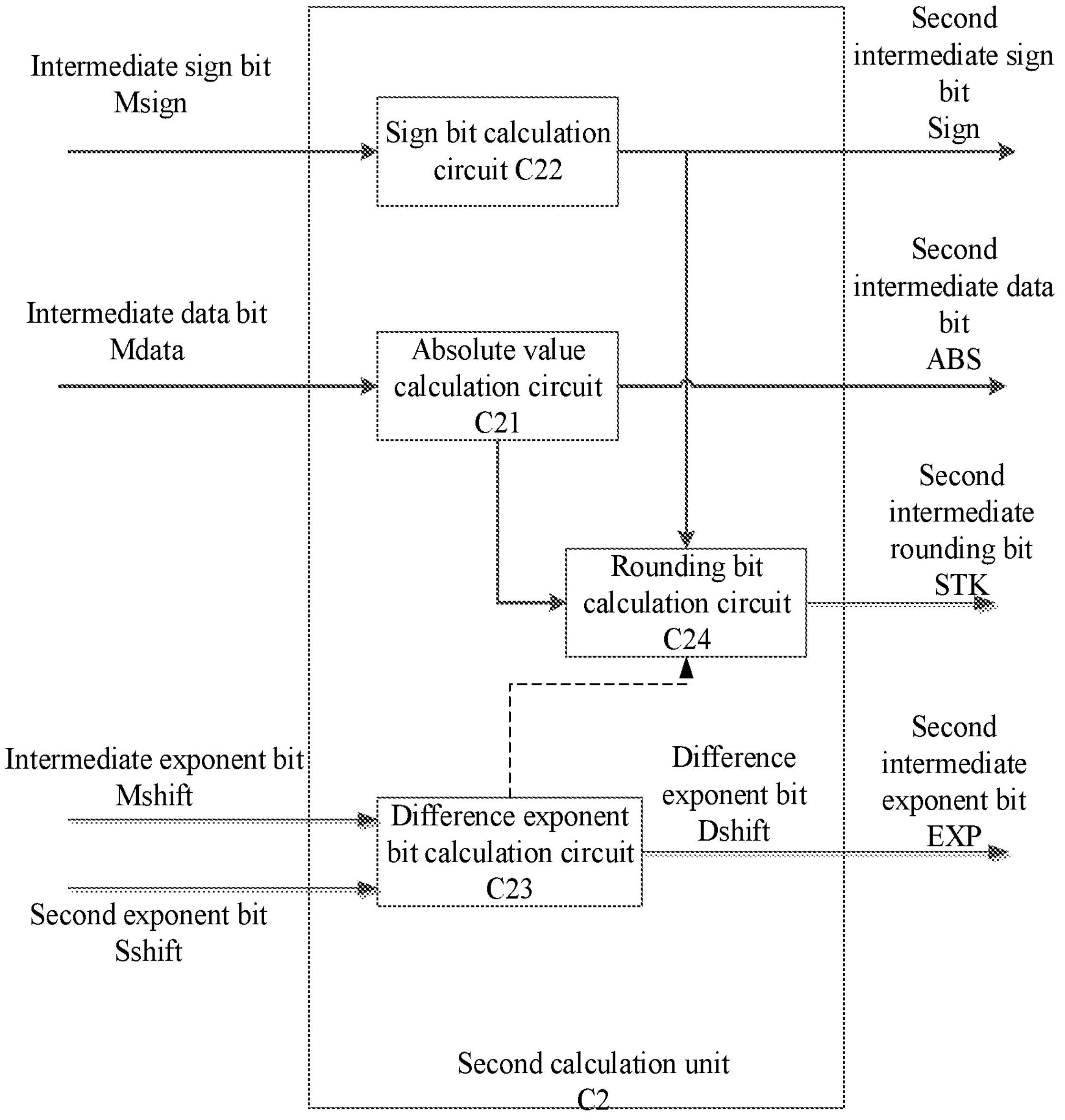

FIG. 7*b* shows a schematic block diagram of a second calculation unit C2 according to another implementation of the present disclosure.

Figure 8A:
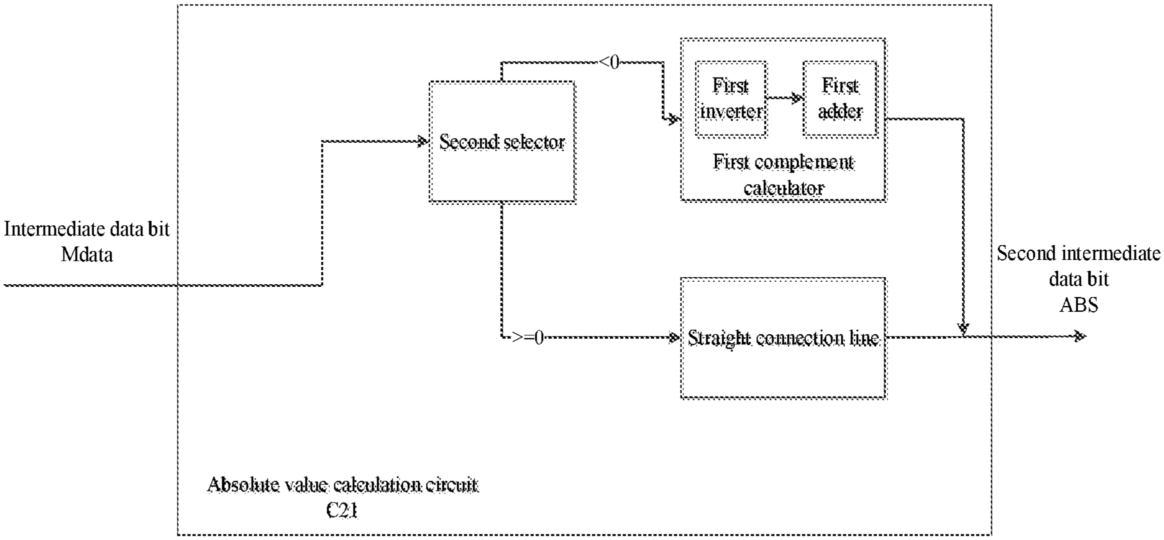

FIG. 8*a* shows a schematic block diagram of an absolute value calculation circuit C21 according to an implementation of the present disclosure.

Figure 8B:
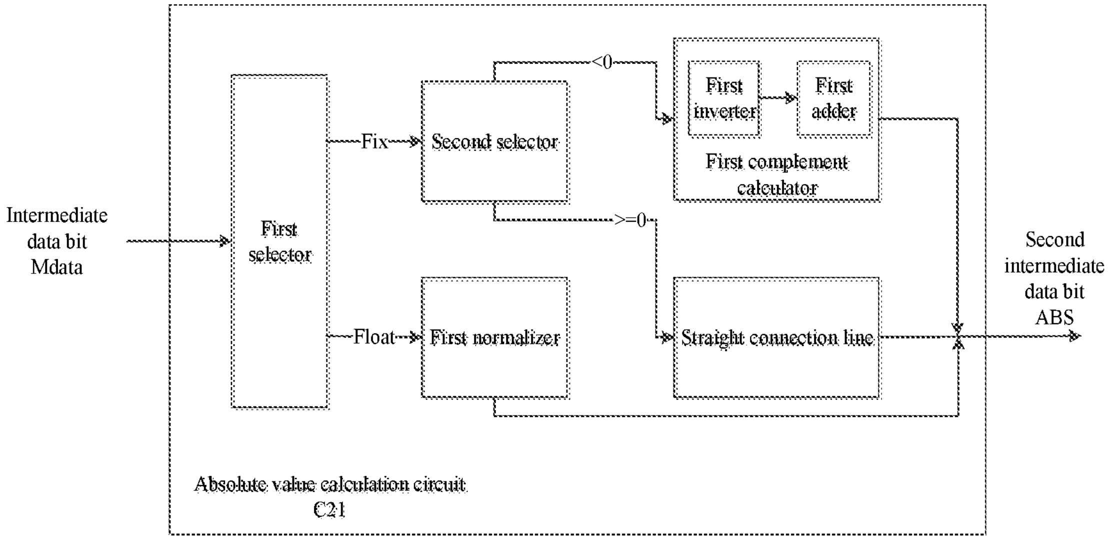

FIG. 8*b* shows a schematic block diagram of an absolute value calculation circuit C21 according to another implementation of the present disclosure.

Figure 9A:
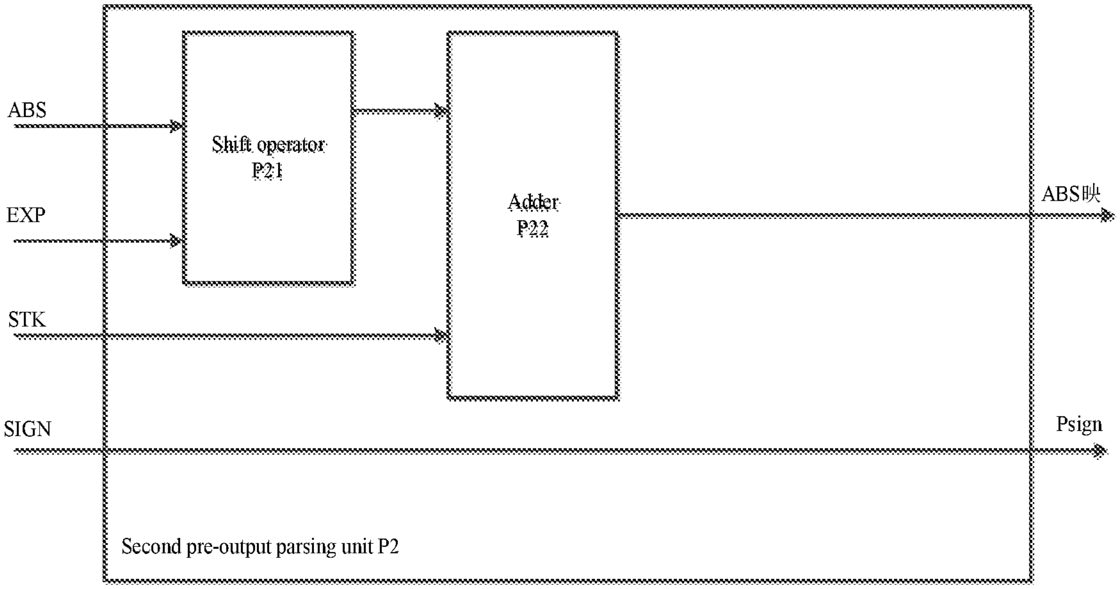

FIG. 9*a* shows a schematic block diagram of a second pre-output parsing unit P2 according to an implementation of the present disclosure.

Figure 9B:
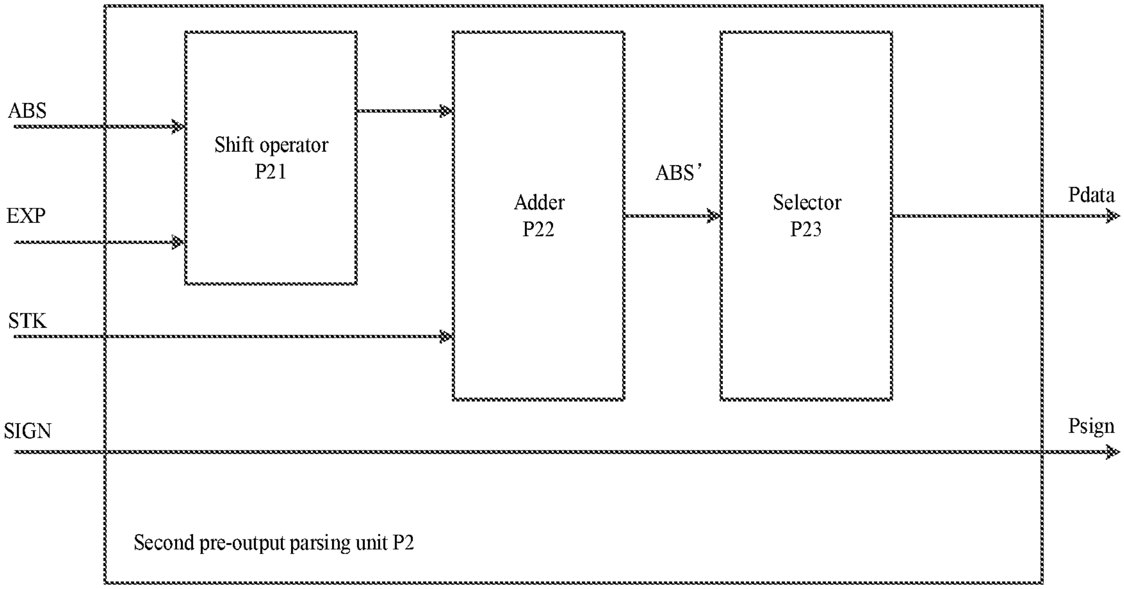

FIG. 9*b* shows a schematic block diagram of a second pre-output parsing unit P2 according to another implementation of the present disclosure.

Figure 10:
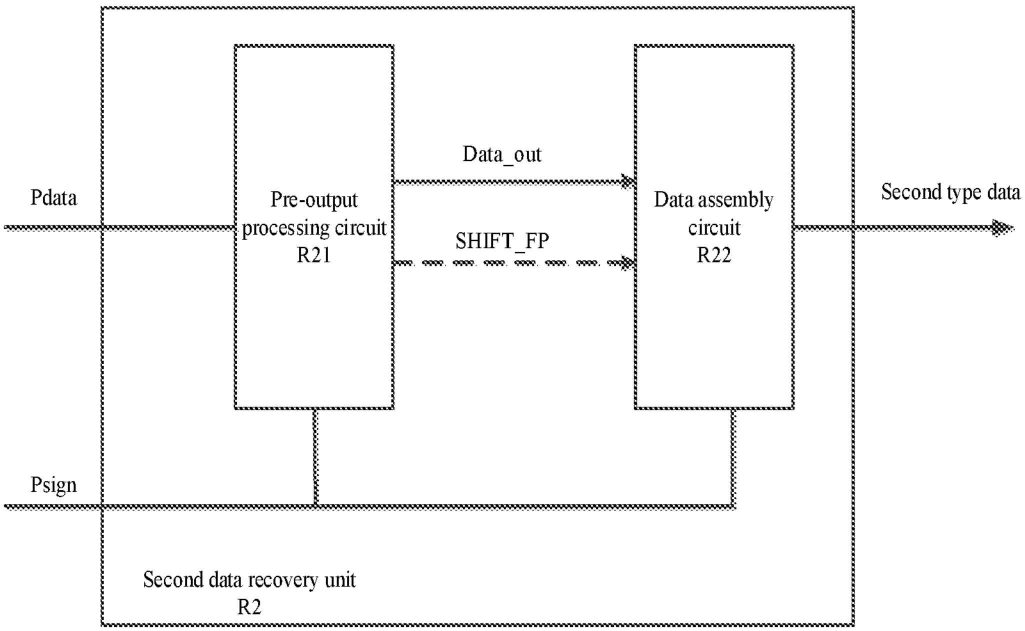

FIG. 10 shows a schematic structural diagram of a second data recovery unit R2 according to an implementation of the present disclosure.

Figure 11A:
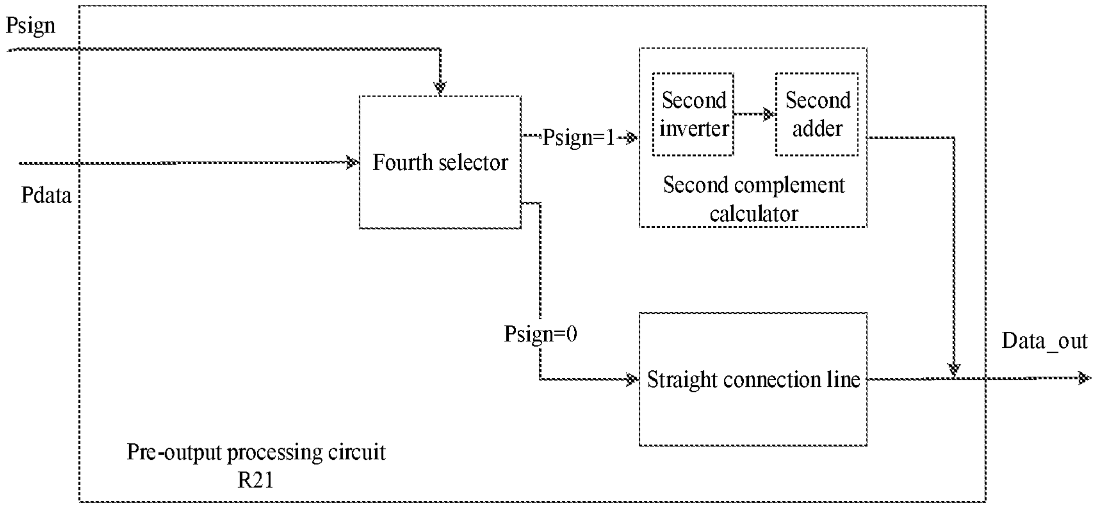

FIG. 11*a* shows a schematic block diagram of a pre-output processing circuit R21 according to an implementation of the present disclosure.

Figure 11B:
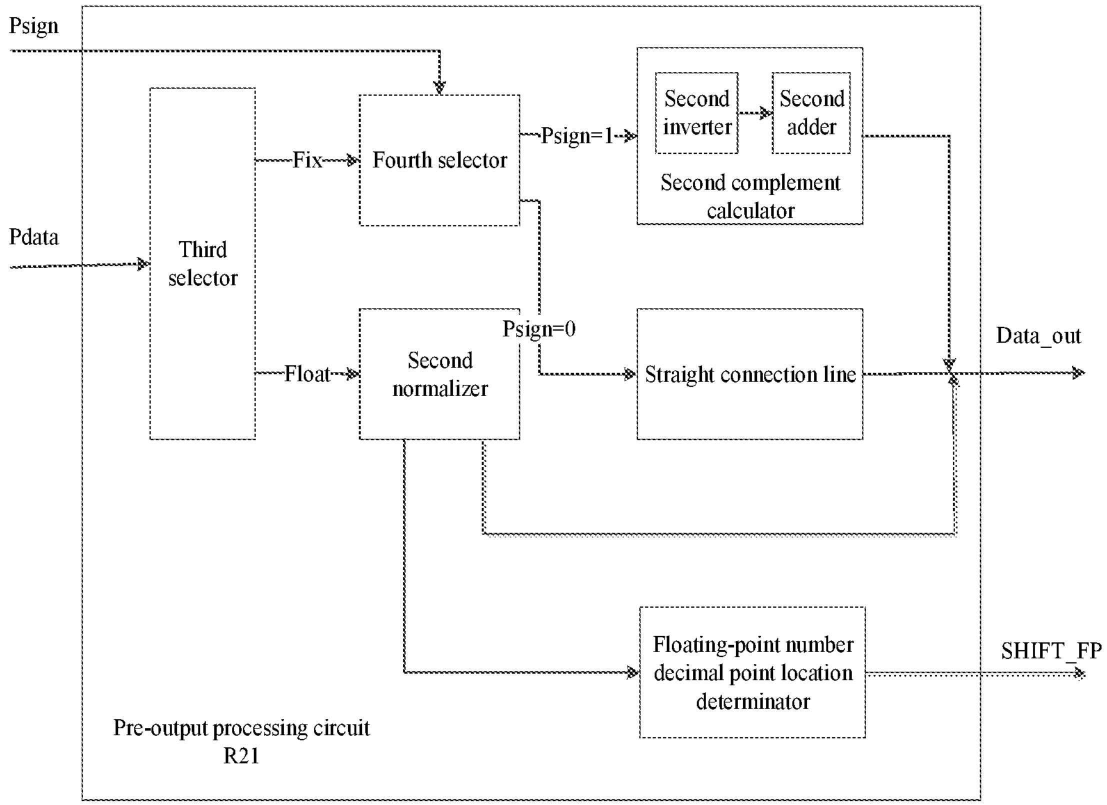

FIG. 11*b* shows a schematic block diagram of a pre-output processing circuit R21 according to another implementation of the present disclosure.

Figure 12:
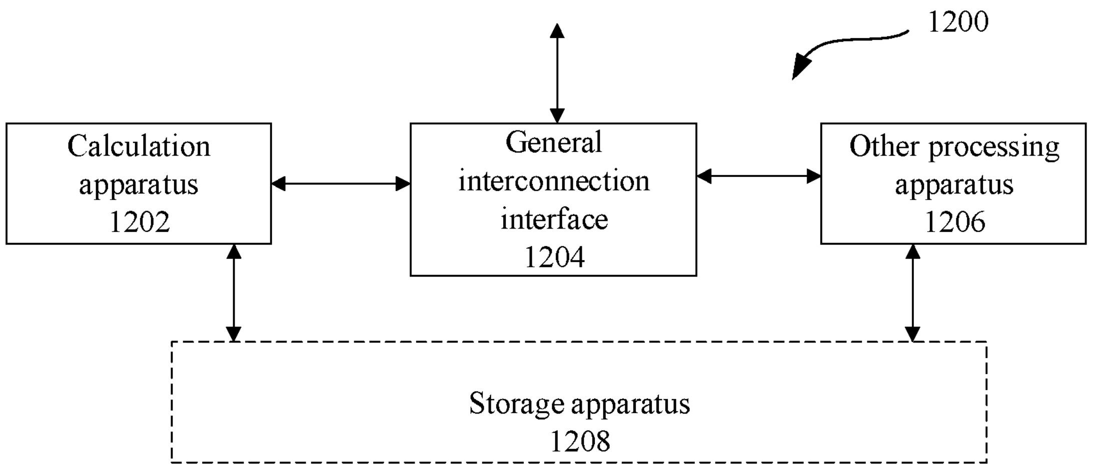

FIG. 12 shows a structural diagram of a combined processing apparatus according to an embodiment of the present disclosure.

Figure 13:
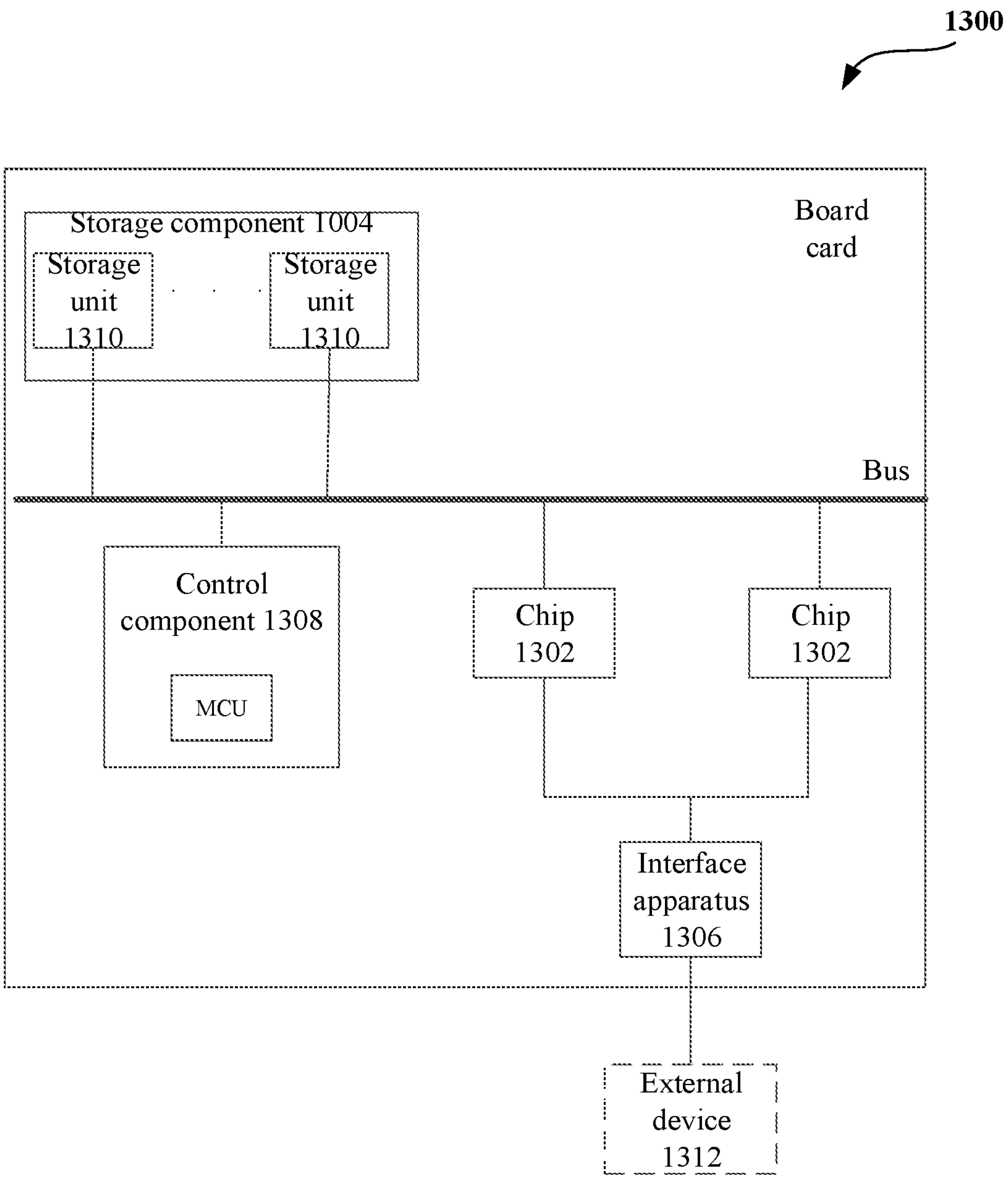

FIG. 13 is a schematic structural diagram of a board card according to an embodiment of the present disclosure.

DETAILED DESCRIPTION OF THE EMBODIMENTS

A technical solution in embodiments of the present disclosure will be described clearly and completely hereinafter with reference to drawings in the embodiments of the present disclosure. Obviously, embodiments to be described are merely some rather than all embodiments of the present disclosure. All other embodiments obtained by those skilled in the art based on the embodiments of the present disclosure without creative efforts shall fall within the protection scope of the present disclosure.

Figure 1:
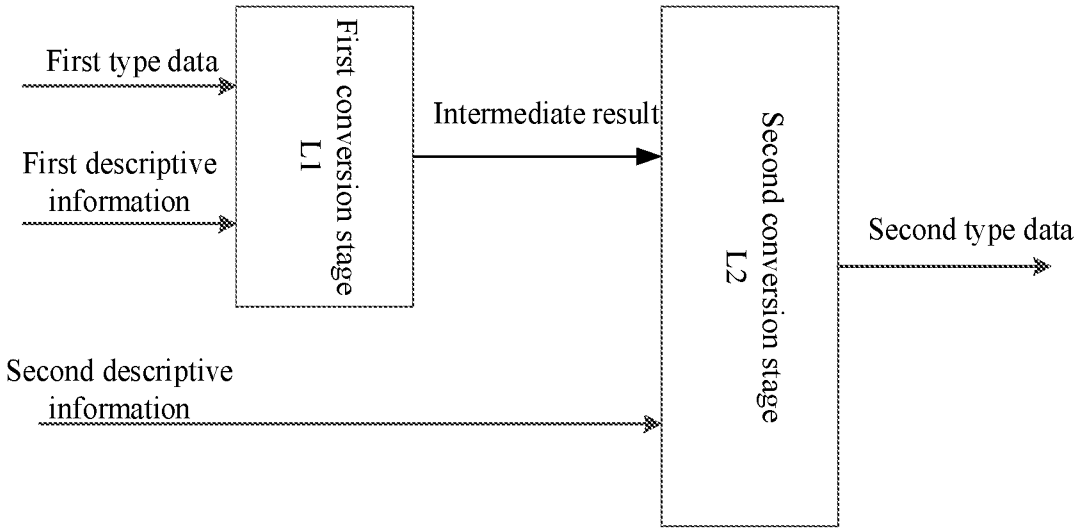
FIG. 1 shows a converter for data type conversion according to a first aspect of the present disclosure.
Figure 2:
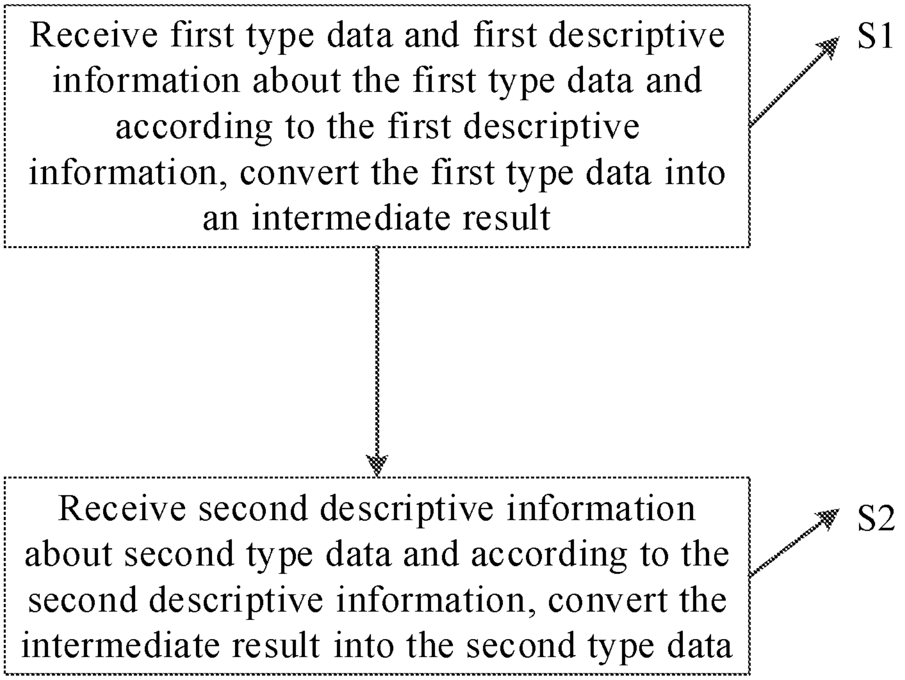
FIG. 2 shows a flowchart of a method for data type conversion according to another aspect of the present disclosure.

FIG. 1 shows a converter for data type conversion according to a first aspect of the present disclosure. FIG. 2 shows a flowchart of a method for data type conversion according to another aspect of the present disclosure.

As shown in FIG. 1, the converter may include: a first conversion stage L1 configured to receive first type data and first descriptive information about the first type data, and according to the first descriptive information, convert the first type data into an intermediate result; and a second conversion stage L2 configured to receive second descriptive information about second type data, and according the second descriptive information, convert the intermediate result into the second type data.

As shown in FIG. 2, the method of the present disclosure may include: a first operation S1, where the first type data and the first descriptive information about the first type data may be received, and according to the first descriptive information, the first type data may be converted into the intermediate result; and a second operation S2, where the second descriptive information about the second type data may be received, and according to the second descriptive information, the intermediate result may be converted into the second type data.

It needs to be understood that although two operations such as S1 and S2 are shown in FIG. 2, steps in the operation S1 and S2 do not have to be executed sequentially, but may also be executed simultaneously. For example, receiving the second descriptive information about the second type data in the operation S2 may be operated before the first operation, at the same time as the first operation or after the first operation.

In the present disclosure, when the type of data is converted, the data may be converted into the intermediate result first, and the intermediate result may be applicable to all types of data. The intermediate result may efficiently represent converted data (such as the aforementioned first type data) and may be converted into any type of data required (such as the aforementioned second type data). In other words, the intermediate result, for all types of data, may have common contents and/or a common structure, and therefore, the data may be converted into other data types through the intermediate result.

The beneficial effects brought by converting the first type data into the intermediate result and then converting the intermediate result into the second type data include but are not limited to the following: in a traditional hardware structure, if there are M types of input data and N types of output data, an individual circuit is required to be designed for each conversion, and therefore, a complexity of the circuit is approximately M*N, which may greatly increase workloads of circuit design and increase circuit areas, thereby further causing adverse effects such as increased power consumption and an increased cost. However, according to a technical solution of the present disclosure, in data type conversion with the same number of data types, the complexity of the circuit is only about M+N, which may greatly decrease complexity of circuit design and reduce the circuit areas, thereby further decreasing power consumption of the circuit and saving costs.

Figure 3:
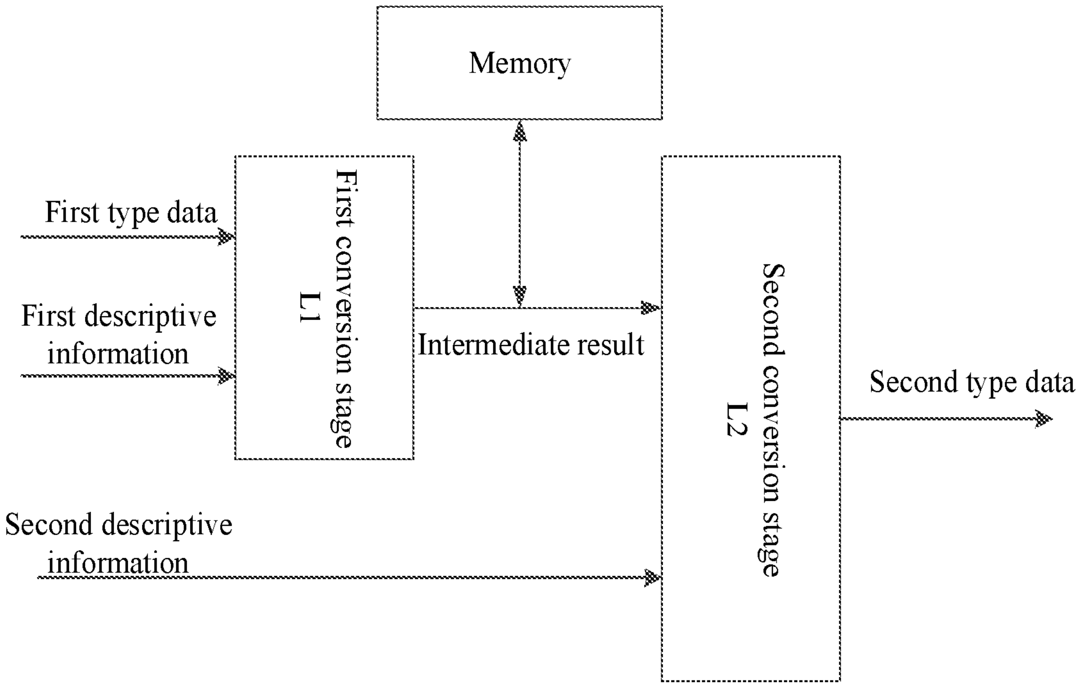
FIG. 3 shows a schematic block diagram of a converter according to an implementation of the present disclosure.

FIG. 3 shows a schematic block diagram of a converter according to an implementation of the present disclosure.

As shown in FIG. 3, the converter of the present disclosure further includes a memory configured to store an intermediate result.

Since the intermediate result is generated according to first type data and is unrelated to a data type of second type data, the intermediate result generated according to the first type data may be pre-stored, and regardless of the data type of second type data, the second type data may be obtained according to the pre-stored intermediate result. As such, the first type data is not required to be converted in each conversion, which may avoid repeated calculations in the chip and have a beneficial effect on reducing power consumption, decreasing circuit areas, and saving costs.

Figure 4:
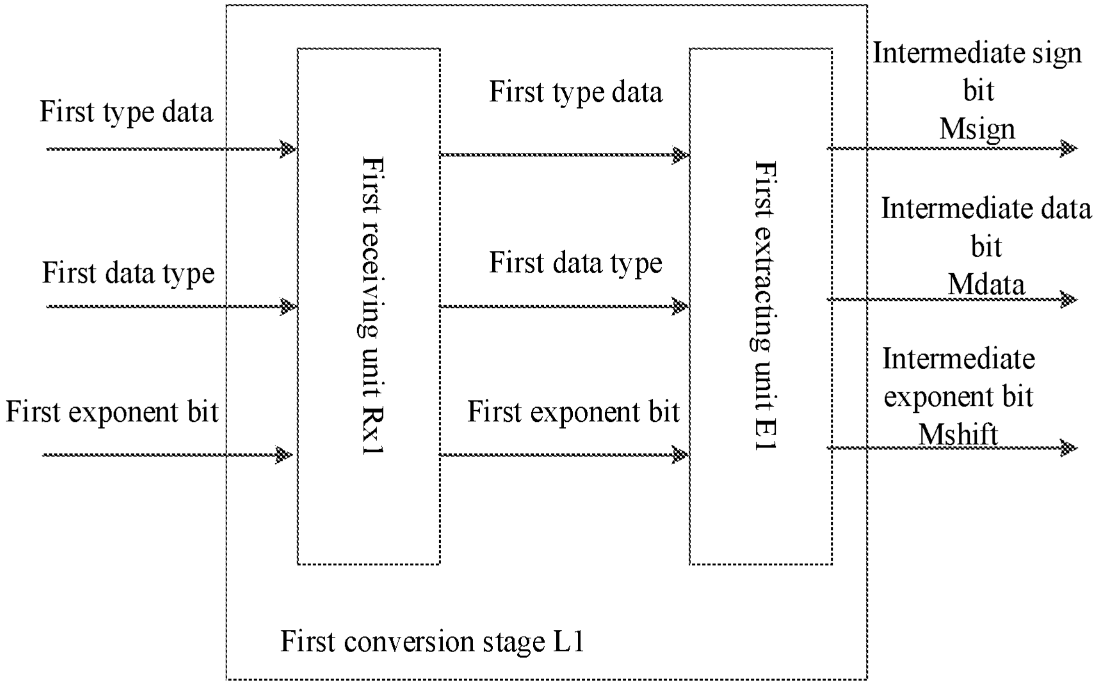
FIG. 4 shows a schematic block diagram of a first conversion stage L1 according to an implementation of the present disclosure.

FIG. 4 shows a schematic block diagram of a first conversion stage L1 according to an implementation of the present disclosure.

As shown in FIG. 4, the first conversion stage L1 may include a first receiving unit Rx1 and a first extracting unit E1, and the first descriptive information includes a first data type of first type data and a first exponent bit of first type data. The first receiving unit Rx1 may be configured to receive the first type data and the first descriptive information; and the first extracting unit E1 may be configured to, from the first type data and the first descriptive information, extract an intermediate sign bit Msign, an intermediate data bit Mdata, and an intermediate exponent bit Mshift as the intermediate result.

Data types may be multiple data types, which include but are not limited to an FIX4, an FIX8, an FIX16, an FIX32, an UFIX8, an UFIX16, an UFIX32, an FP16, an FP32, a BFLOAT, and any other existing or self definition data type.

It needs to be understood that here only takes the highest 32 bits as examples for explanation, for 64 bits or other higher bits, a larger number of data types may be included.

The intermediate sign bit Msign represents the plus or minus of the first type data. For example, if a sign bit is 0, it is showed that this piece of data is a nonnegative number, and if the sign bit is 1, it is showed that this piece of data is a negative number. The intermediate data bit Mdata represents actual significant data of this piece of data, and the intermediate exponent bit Mshift represents a shift value of this piece of data.

Figure 5:
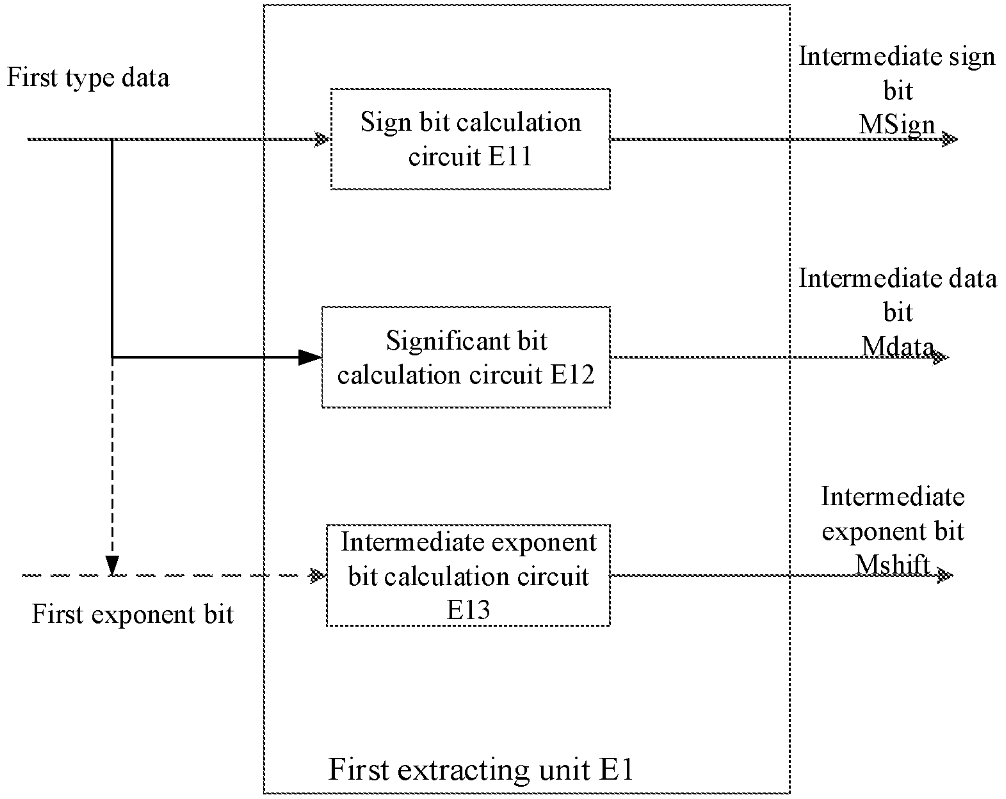
FIG. 5 shows a schematic block diagram of a first extracting unit E1 according to an implementation of the present disclosure.

FIG. 5 shows a schematic block diagram of a first extracting unit E1 according to an implementation of the present disclosure.

As shown in FIG. 5, the first extracting unit E1 may include: a sign bit calculation circuit E11, a significant bit calculation circuit E12, and an intermediate exponent bit calculation circuit E13. The sign bit calculation circuit E11 may be configured to, from the first type data, extract a sign of first type data as the intermediate sign bit Msign; the significant bit calculation circuit E12 may be configured to, from the first type data, extract a significant data bit of first type data as the intermediate data bit Mdata; and the intermediate exponent bit calculation circuit E13 may be configured to, according to the first type data or a first exponent bit, obtain exponent information of first type data as the intermediate exponent bit Mshift.

It needs to be understood that expressions such as "as the intermediate sign bit Msign", "as the intermediate data bit Mdata", "as the intermediate exponent bit Mshift" described above may represent that an output of a corresponding circuit is the same as the intermediate result, but in some embodiments, it is represented that the output of the corresponding circuit is an equivalence of the intermediate result. It needs to be understood that here, a term "equivalence" indicates that two terms may be the same substantially, but different in form. For example, for an 8-bit number 0000 0001, when the number is converted into 0000 0000 0000 0001, in essence, it is another representation manner of the previous 8-bit number, but two numbers may not be exactly the same. Additionally, it needs to be understood that, in addition to change in bit number, different representations of a number such as a complement, a shift code, a binary, a decimal, hexadecimal, and the like, may also be within the scope of "equivalence" described in the present disclosure. In other words, as long as significant information has not been discarded, any form of change may be regarded as the equivalence.

Although the descriptive information and the data are explained as two different message carriers in the above, it needs to be understood that there may not be a clear boundary between the descriptive information and the data in practice. For example, if a data type of the first type data is a Fix, a shift value or an exponent bit of the first type data may be indicated in separate descriptive information, and the intermediate exponent bit Mshift may be obtained according to the shift value. However, if the data type of the first type data is a Float, since Float-type data itself includes the shift value, the first extracting unit E1 may directly extract a first shift value from the first type data. Therefore, the first type data and the first descriptive information may be mixed together, or independent. Therefore, in the first extracting unit E1 shown in FIG. 5, the intermediate exponent bit calculation circuit E13 may extract the exponent information (for example, when the data type of the first type data is the Fix) from the first descriptive information, or may extract the exponent information (for example, when the data type of the first type data is the Float) from the first type data.

It needs to be understood that the aforementioned expression "first type data" may be original first type data, or converted, concatenated, and split first type data; in other words, deformations of the first type data in each phrase may be also included in the scope of the first type data.

The number of bits of the first type data described above may be multiple cases, for example, 1 bit, 2 bits, 4 bits, 8 bits, 16 bits, 32 bits, and the like. However, in the present disclosure, the number of processing bits of the converter that is adopted (such as the bit width of a register, the bit width of a memory, and the bit width of a bus) may be other bit numbers, for example, 32 bits. Therefore, according to an implementation of the present disclosure, the first conversion stage L1 may be further configured to determine the number of first type data received and concatenate the first type data to form first concatenation data, and according to the first descriptive information, the first conversion stage L1 may convert the first concatenation data into the intermediate result.

According to an implementation of the present disclosure, the number of first type data received may be determined by dividing the number of bits of the first type data by the number of processing bits of the converter.

For example, if the number of bits of input data is 8 bits, while the number of processing bits of the converter (such as the bit width of the register) is 32 bits, 4 pieces of input data may be received simultaneously at one time, which means that the 4 pieces of input data may be concatenated to form one piece of 32-bit data.

According to another implementation of the present disclosure, a preset first fixed value may be used to determine the number of concatenated first type data.

For example, if two 8-bit hexadecimal numbers such as 81 and 82 are input, 4 pieces of data may be received at one time, and 2 pieces of data may be preset for receiving at one time. In an embodiment of the present disclosure, binary representations of hexadecimal numbers such as 81 and 82 are expressed as "1000 0001" and "1000 0010" respectively, which may be expanded to two 16-bit numbers such as "xxxx xxxx 1000 0001" and "yyyy yyyy 1000 0010". Actual data of an 8-bit number is placed on the low 8 bits of a 16-bit number, and the high bits of the 16-bit number are filled with 0 or other specified numbers (here, the numbers are represented by x). Concatenated data may be 00008182, and a binary representation of the concatenated data may be expressed as "xxxx xxxx yyyy yyyy 1000 0001 1000 0010". In other words, in 32-bit concatenated data, a first piece of input data "81" may occupy the low 8 bits (0-7), and a second piece of input data "82" may occupy the intermediate 8 bits (8-15). The high bits of the 32-bit number (16-32) may be filled with x and y, where x and y may be set according to actual situations, and the x and y may be the same or different. The following will give a detailed explanation.

It needs to be understood that the above-mentioned concatenation method is only exemplary, and those skilled in the art may set concatenated data with a required format according to needs. For example, a first piece of data received may be placed on the low 16 bits of 32-bit concatenated data, and a second piece of data received may be placed on the high 16 bits of the 32-bit concatenated data. Still taking the above-mentioned hexadecimal numbers such as 81 and 82 as examples for explanation, a data format after concatenation may also be, for example, xxxx xxxx 1000 0001 yyyy yyyy 1000 0010, where x and y may be the same or different.

Of course, those skilled in the art may understand that the above-mentioned data concatenation is not necessarily required, but preferred. For example, other specified formats may also be used (for example, a method of marking significant bits may be adopted; in other words, which bits are significant and which bits are invalid may be pre-specified). According to another implementation, the data may not be concatenated, and only the number of bits of input data may be expanded. For example, if the number of bits of input data is 8 bits, 8-bit input data may be directly expanded to 32-bit data (for example, by filling the specific bit of the previous 8-bit input data with 0).

The above describes the case that the number of bits of the first type data is less than the number of bits of the register, and in another case, if the number of bits of the input data is greater than the number of processing bits of the converter, for example, if the number of bits of the input data is 64 bits and the number of processing bits of the converter is 32 bits, the following processing may be operated.

One processing method is to truncate this piece of 64-bit data, reserve 32-bit data required and discard other 32-bit data, and process 32-bit data reserved. This method may cause certain data loss and errors.

According to another implementation of the present disclosure, the first conversion stage L1 may be further configured to determine the number of to-be-split first type data received and split the first type data to split data with the same number, and according to the first descriptive information, the first conversion stage L1 may convert the split data into the intermediate result.

In this implementation, this piece of 64-bit data may be split into two pieces of 32-bit data, and the two pieces of 32-bit data that are split may be processed and the intermediate result may be generated.

According to an implementation of the present disclosure, the number of to-be-split first type data received may be determined by: dividing the number of processing bits of the converter by the first type data.

According to another implementation of the present disclosure, a preset second fixed value may be used for splitting. For example, a fixed value may be set as 2 or other numbers.

Splitting and concatenating data is beneficial to avoid or reduce extra design of a timing control part of a circuit; additionally, this implementation is beneficial for data parallel processing, resource utilization improvement, and data throughout improvement.

Corresponding splitting and concatenation functions may be added to the above-mentioned first conversion stage L1. The functions may be implemented in the form of software and/or hardware.

It is shown that the present disclosure does not limit the number of bits of input, the number of bits of output and the number of bits of the converter (for example, the register), and through data splitting method and data concatenation method, the present disclosure may process data with any bit number.

The following will describe the function and structure of the second conversion stage L2 in detail.

Figure 6:
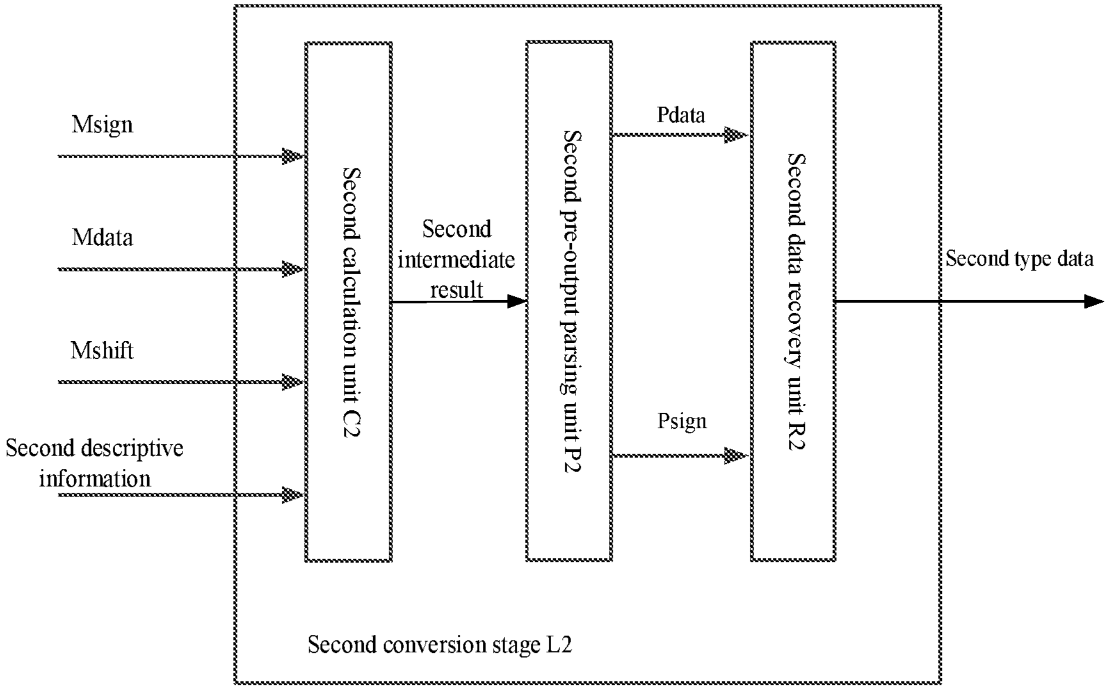
FIG. 6 shows a schematic block diagram of a second conversion stage L2 according to an implementation of the present disclosure.

FIG. 6 shows a schematic block diagram of a second conversion stage L2 according to an implementation of the present disclosure.

As shown in FIG. 6, the second conversion stage L2 may include a second calculation unit C2, a second pre-output parsing unit P2, and a second data recovery unit R2. The second calculation unit C2 may be configured to receive an intermediate result and second descriptive information, and according to the intermediate result and the second descriptive information, calculate a second intermediate result; and the second pre-output parsing unit P2 may be configured to calculate a pre-output data bit Pdata and a pre-output sign bit Psign according to the second intermediate result; and the second data recovery unit R2 may be configured to generate second type data according to the pre-output data bit Pdata and the pre-output sign bit Psign.

The second calculation unit C2 may receive the intermediate result from the first conversion stage L1 or the memory and further receive the second descriptive information about the second type data.

Similar to the first descriptive information, the second descriptive information may include information about a data type of second type data. For example, the data type of second type data includes but is not limited to an FIX4, an FIX8, an FIX16, an FIX32, an UFIX8, an UFIX16, an UFIX32, an FP16, an FP32, a BFLOAT, and any other existing or self definition data type. The second type data may further include a shift value of second type data, and the like. The second descriptive information may be input to the second calculation unit C2 manually or in the form of a file or a signal.

According to an implementation of the present disclosure, the first descriptive information and/or the second descriptive information may further include a rounding type, where the rounding type may include at least one of the followings: a TO_ZERO, an OFF_ZERO, an UP, a DOWN, a ROUNDING_OFF_ZERO, a ROUNDING_TO_EVEN, and a random rounding.

The TO_ZERO represents rounding toward a zero; in other words, the TO_ZERO represents rounding toward a smaller absolute value. The OFF_ZERO represents rounding away from a zero; in other words, the OFF_ZERO represents rounding toward a greater absolute value. The UP represents rounding toward a positive infinity. The DOWN represents rounding toward a negative infinity. The ROUNDING_OFF_ZERO represents rounding up and rounding down. The ROUNDING_TO_EVEN represents that on a basis of rounding up and rounding down, exactly half of the values is rounded to an even number.

It needs to be understood immediately that the above-mentioned rounding type is only exemplary, and those skilled in the art may set various expected rounding types.

FIG. 7a shows a schematic block diagram of a second calculation unit C2 according to an implementation of the present disclosure.

As shown in FIG. 7a, according to an implementation of the present disclosure, the second descriptive information may include a second data type of second type data and a second exponent bit Sshift of second type data. The second calculation unit C2 may include: an absolute value calculation circuit C21 configured to calculate a second intermediate data bit ABS according to the intermediate data bit Mdata; a sign bit calculation circuit C22 configured to calculate a second intermediate sign bit Sign according to the intermediate sign bit Msign; and a difference exponent bit calculation circuit C23 configured to calculate a difference exponent bit Dshift between the intermediate exponent bit Mshift and the second exponent bit Sshift as a second intermediate exponent bit (EXP).

It needs to be explained that the "difference" described above, in addition to indicating a size of shift, also indicates the direction of shift. The difference described in the present disclosure may be first exponent bit minus second exponent bit, or second exponent bit minus first exponent bit. For those skilled in the art, it is clear and it is not required to be repeated here.

FIG. 7*b* shows a schematic block diagram of a second calculation unit C2 according to another implementation of the present disclosure.

As shown in FIG. 7*b*, according to an implementation of the present disclosure, the second calculation unit (C2) may further include: a rounding bit calculation circuit C24 configured to calculate a second intermediate rounding bit STK according to the second intermediate data bit ABS and the second intermediate sign bit Sign.

According to another implementation of the present disclosure, the second calculation unit C2 may further include: the rounding bit calculation circuit C24 configured to calculate the second intermediate rounding bit STK according to the second intermediate data bit (ABS), the second intermediate exponent bit EXP, and the second intermediate sign bit Sign.

In the above two implementations of calculating the second intermediate rounding bit STK, the difference exponent bit may be used or not be used. For example, if the second intermediate rounding bit STK adopts a manner of an array (for example, all rounding contents are required to be reserved), an intermediate sign bit exponent bit EXP may not be adopted; and if the intermediate rounding bit is especially required to indicate one bit or several bits, the intermediate sign bit exponent bit EXP may be adopted.

According to an implementation of the present disclosure, the rounding bit calculation circuit C24 may be implemented by an and-or logic. For example, rounding up and rounding down: STK=ABS; rounding toward a positive infinity: STK [n]=|ABS[n:x1] && ~SIGN, and the like.

As shown in FIG. 7*a*, through the above-mentioned converter and method, all intermediate results may be converted into the second intermediate result with the same contents. In other words, according to an implementation of the present disclosure, the second intermediate result may include the second intermediate sign bit Sign, the second intermediate exponent bit EXP, and the second intermediate data bit ABS.

As shown in FIG. 7*b*, according to another implementation of the present disclosure, the second intermediate result may include the second intermediate sign bit Sign, the second intermediate exponent bit EXP, the second intermediate data bit ABS, and the second intermediate rounding bit STK.

The rounding bit calculation circuit C24 in FIG. 7*a* and FIG. 7*b* may be placed on the second pre-output parsing unit P2; in other words, the second pre-output parsing unit P2 may receive the second intermediate result including the second intermediate sign bit Sign, the second intermediate exponent bit EXP, and the second intermediate data bit ABS and calculate the second intermediate rounding bit STK according to the second intermediate result.

FIG. 8*a* shows a schematic block diagram of an absolute value calculation circuit C21 according to an implementation of the present disclosure.

As shown in FIG. 8*a*, the absolute value calculation circuit C21 may include: a second selector configured to judge whether the intermediate data bit Mdata is less than 0; a first complement calculator configured to calculate a complement of the intermediate data bit Mdata as the second intermediate data bit ABS if the intermediate data bit Mdata is less than 0, otherwise, the intermediate data bit Mdata is taken as the second intermediate data bit ABS. Calculating the complement is actually to invert bits, other than the sign bit, and add 1. Therefore, the first complement calculator may include a first inverter and a first adder. However, if the transition data bit and the intermediate data bit are greater than or equal to 0 (in other words, the transition data bit and the intermediate data bit are not negative), the intermediate data bit ABS may be equal to the transition data bit Mdata.

FIG. 8*b* shows a schematic block diagram of an absolute value calculation circuit C21 according to another implementation of the present disclosure.

As shown in FIG. 8*b*, the absolute value calculation circuit C21 may further include a first selector and a first normalizer. The first selector may be configured to judge whether a data type of the intermediate data bit Mdata is a first type or a second type.

The above-mentioned first type may be, for example, a Fix, and the second type may be, for example, a Float. In the following or the description of the drawings, the Fix may be taken as an example of the first type, and the Float may be taken as an example of the second type for description. It needs to be understood that the first type data and the second type data may also be any other suitable data types.

If the data type of the intermediate data bit Mdata is the Fix, the second selector may be selected for processing and whether the transition data bit Mdata is less than 0 may be judged. If the transition data bit Mdata is less than 0 (in other words, the transition data bit Mdata is negative), the complement of the transition data bit Mdata may be calculated in the first complement calculator, and the complement of the transition data bit Mdata may be taken as the intermediate data bit ABS. Calculating the complement is actually to invert bits, other than the sign bit, and add 1. Therefore, the first complement calculator may include a first inverter and a first adder. However, if the transition data bit Mdata is greater than or equal to 0 (in other words, the transition data bit Mdata is not negative), the intermediate data bit ABS is equal to the transition data bit Mdata.

If the data type of the intermediate data bit Mdata is the Float, the first normalizer may be selected for processing. The first normalizer may be configured to normalize the intermediate data bit Mdata as the second intermediate data bit ABS if the data type of the intermediate data bit Mdata is the Float.

Normalization is an operation for Float-type numbers. There are several types of Float-type numbers in the definition of an IEEE754 standard, including a normalized number, a denormalized number, a zero, a positive infinity, a negative infinity, and non-numbers. In this operation, by adding 1 to the front of all normalized numbers and by complementing 0 to the back of all denormalized numbers, an actual original code representation result of a number is formed. The result has one more bit than normalization/non-normalization representation results in the Float type.

Further, as shown in FIG. 7*a* and FIG. 7*b*, the difference exponent bit calculation circuit C23 may be configured to calculate the difference exponent bit Dshift according to the intermediate exponent bit Mshift and the second exponent bit Sshift and further obtain the second intermediate exponent bit EXP. According to an implementation of the present disclosure, the above-mentioned second intermediate exponent bit EXP is equal to the aforementioned difference exponent bit Dshift.

Further, as shown in FIG. 7*a* and FIG. 7*b*, the sign bit calculation circuit C22 may be configured to calculate the second intermediate sign bit Sign according to the intermediate sign bit Msign. It needs to be understood that since a sign does not change, the second intermediate sign bit Sign may be calculated through a straight connection line according to the intermediate sign bit Msign.

The above-mentioned rounding bit calculation circuit C24 may be implemented by an and-or logic.

FIG. 9*a* shows a schematic block diagram of a second pre-output parsing unit P2 according to an implementation of the present disclosure.

As shown in FIG. 9*a*, the second pre-output parsing unit P2 may be configured to calculate a pre-output data bit Pdata and a pre-output sign bit Psign according to the second intermediate data bit ABS, the second intermediate sign bit Sign, the second intermediate exponent bit EXP, and the second intermediate rounding bit STK.

Further, as shown in FIG. 9*a*, the second pre-output parsing unit P2 may include a shift operator P21 and an adder P22, and the second pre-output parsing unit P2 may be configured to generate a temporary output data bit ABS' and the pre-output sign bit Psign. The shift operator P21 may be configured to shift the second intermediate data bit ABS by the second intermediate exponent bit EXP to obtain a shift result; the adder P22 may be configured to generate a temporary data bit ABS' according to the shift result and the second intermediate rounding bit STK; and the pre-output sign bit Psign may be equal to the second intermediate sign bit Sign.

First, in the pre-output parsing unit P2, the intermediate data bit ABS that is received may be shifted, and the amount and direction of shift may be determined by the intermediate exponent bit EXP. The shift result obtained may be input to a next adder.

The output of the adder is ABS'=the output result of the shift operator +STK[—EXP−1]. If the STK is out of range, the STK takes a zero. It needs to be explained that the STK is an array, for example, a 32-bit array STK[31:0]. Here, a STK[0] is an element of the lowest bit, and a STK[31] is an element of the highest bit. When −EXP−1 is calculated, if the −EXP−1 is in a range of 0-31, a corresponding value may be taken; if the −EXP−1 is less than 0, the −EXP−1 takes 0; and if the −EXP−1 is greater than 0, special processing may be performed (for example, according to the type of the STK, the −EXP−1 may take 0 or 31).

In a specific case, for example, if the ABS' does not overflow, the ABS' may be directly taken as an output of the pre-output parsing unit P2.

FIG. 9*b* shows a schematic block diagram of a second pre-output parsing unit P2 according to another implementation of the present disclosure.

As shown in FIG. 9*b*, the pre-output parsing unit P2 may further include a selector P23. In the selector P23, whether a generated ABS' overflows may be judged. If the generated ABS' overflows, saturation processing may be performed on the ABS', and if the generated ABS' does not overflow, Pdata=ABS'.

The saturation processing is processing for a special case that occurs in all kinds of computation units. In the process of computation including the computation of conversion numbers, there appears a case that a result obtained from input data may be different from a value range of output data: if an absolute value of a result that should be obtained is greater than an upper limit of an absolute value of a representation range of output data, there appears an overflow; if the absolute value of the result that should be obtained is less than a lower limit of the absolute value of the representation range of the output data, there appears an underflow. There are several processing methods for an overflow situation: taking saturation values, truncating high bits, and taking infinity or special values. Any method may be adopted by the present disclosure for saturation processing.

Additionally, an intermediate sign bit SIGN may be output as the Psign through the straight connection line; in other words, the sign does not change.

Additionally, the pre-output exponent bit Pshift is not shown in both FIG. 9*a* and FIG. 9*b*. If all data shifts are completed, Pshift=0.

For output data in both FIG. 9*a* and FIG. 9*b*, in some specific cases (for example, both a data type of input and a data type of output are the Fix and signs thereof are positive), for example, the temporary output data bit ABS', the pre-output data bit Pdata and the pre-output sign bit Psign, may directly become second output data without further processing.

FIG. 9*a* and FIG. 9*b* show another implementation of the second pre-output parsing unit P2 of the present disclosure. In FIG. 9*a* and FIG. 9*b*, both the Pdata and the Psign that are output may be output externally for further processing.

FIG. 10 shows a schematic structural diagram of a second data recovery unit R2 according to an implementation of the present disclosure.

As shown in FIG. 10, the second data recovery unit R2 may include a pre-output processing circuit R21, and in some embodiments, the second data recovery unit R2 may further include a data assembly circuit R22. The pre-output processing circuit R21 may be configured to receive the pre-output data bit Pdata and the pre-output sign bit Psign to generate an output data bit representation Data_out; and the data assembly circuit R22 may be configured to generate the second type data according to the output data bit representation Data_out and the pre-output sign bit Psign.

A data assembly may be an inverse operation of data concatenation described above; in other words, the data assembly may recover concatenated data to second type data that is required. Those skilled in the art may determine whether this assembly circuit is required to be added according to actual data types. For example, for data that are not concatenated, the data assembly circuit R22 is not required, and therefore, the data assembly circuit R22 may be preferred but not necessarily required.

For example, if an input is a 32-bit Float-type number, and an output is a 32-bit Fix-type number, at this time, there is no concatenation or splitting when the number is input, and therefore, in terms of length, the data assembly circuit R22 is not required.

As shown in FIG. 10, the pre-output processing circuit R21 in the second data recovery unit R2 may receive the temporary output data bit ABS' and the pre-output sign bit Psign in FIG. 9*a*, or receive the pre-output data bit Pdata and the pre-output sign bit Psign in FIG. 9*b*, to obtain the output data bit representation Data_out.

For data with a specific data type, for example, nonnegative Fix-type data, the output data bit representation may be equal to the pre-output data Pdata, and special deformations or processing are not required.

Considering that there exist other data types such as the Float in the data types, the pre-output processing circuit R21 of the present disclosure may be further configured to generate a floating-point number decimal point bit representation SHIFT_FP.

Further, as shown in FIG. 10, the data assembly circuit R22 may obtain final second type data according to the output data bit representation Data_out, a floating-point number decimal point bit number representation SHIFT_FP, and the pre-output sign bit Psign. It needs to be understood that in FIG. 8, the floating-point number decimal point bit number representation SHIFT_FP is shown by a dotted line, which shows that the SHIFT_FP, in a specific case, may not exist, and in this case, the data assembly circuit R22 may be configured to obtain the second type data according to a data output bit representation Data_out and the pre-output sign bit Psign.

FIG. 11*a* shows a schematic block diagram of a pre-output processing circuit R21 according to an implementation of the present disclosure.

As shown in FIG. 11*a*, the pre-output processing circuit R21 of the present disclosure may include: a fourth selector and a second complement calculator.

In FIG. 11*a*, the fourth selector receives the Pdata and the pre-output sign bit Psign. Whether the Psign is a positive number or a negative number may be judged; in other words, whether the Psign is equal to 1 or 0 may be judged.

If Psign=1, the Pdata may enter the second complement calculator, where the second complement calculator may include a second inverter and a second adder, where the second inverter may invert all bits, other than the sign bit, and then the second adder may add 1. Next, the second complement calculator outputs a result as the output data bit representation Data_out.

If Psign=0, the Pdata may be directly output as the output data bit representation Data_out.

Considering that the data has multiple types, the pre-output data bit Pdata may be judged in advance to determine subsequent processing.

FIG. 11*b* shows a schematic block diagram of a pre-output processing circuit R21 according to another implementation of the present disclosure.

As shown in FIG. 11*b*, the pre-output processing circuit R21 may further include: a third selector, a second normalizer, and a floating-point number decimal point location determinator.

The third selector may receive the pre-output data bit Pdata and judge whether a data type of the pre-output data bit Pdata is a Fix or a Float. If the data type of the pre-output data bit Pdata is the Fix, the pre-output data bit Pdata may be sent to the fourth selector, and if the data type of the pre-output data bit Pdata is the Float, the pre-output data bit Pdata may be sent to the second normalizer.

The second normalizer may normalize the pre-output data bit Pdata and output a normalized pre-output data bit Pdata as the data output bit representation Data_out.

In the definition of normalized numbers, it is through a simple size comparison to distinguish a normalized number and a denormalized number. If an absolute value is greater than a representable maximum value of the absolute value (positive and negative saturation values), there is no representation, and there appears an overflow and saturation processing may be performed; if the absolute value is less than the saturation values and greater than a normalization threshold, a normalization operation may be performed; if the absolute value is less than the normalization threshold and greater than a representable minimum value of the absolute value, a non-normalization operation may be performed; if the absolute value is less than the representable minimum value of the absolute value, there appears an underflow and the saturation processing may be performed (such as taking 0, taking the representable minimum value, or taking a special value). In the second conversion stage L2, normalization is to delete 1 in the first place, and non-normalization is to shift 1 bit to the right, which is an inverse operation of the previous normalization operation in the first conversion stage L1.

The floating-point number decimal point location determinator may determine the floating-point number decimal point bit number representation SHIFT_FP according to an output of the second normalizer.

It needs to be noted that data of various phrases above may keep consistent in terms of bit number in each phrase. For example, if the first type data is concatenated (for example, two pieces of 16-bit data are concatenated to form one piece of 32-bit data), the intermediate data bit Mdata may also be one piece of data that is concatenated by two pieces of data. Similarly, the second intermediate result (for example, the Sign, the ABS, the EXP, and the STK), the pre-output data (for example, the pre-output data bit Pdata and the pre-output sign bit Psign), the output data bit representation Data_out, and the floating-point number decimal point bit number representation SHIFT_FP may be data that is concatenated by two pieces of data. The form of concatenation may be set according to user requirements.

For the data assembly circuit R22, there may exist multiple cases.

For example, for a 32-bit converter, if an input is a 16-bit Fix-type number, and an output is a 32-bit Fix-type number, converting a 16-bit number that is input to a 32-bit number may be operated by simply adding 0 to high bits, and then a final output may directly be the 32-bit number without any data assembly.

For another example, for a 32-bit converter, if the input is a 32-bit Fix-type number, and the output is a 16-bit Fix-type number, the input may be converted normally in the first conversion stage, and based on converted data, 16 bits of the high bits may be truncated to obtain a final 16-bit Fix-type number.

It may be shown that the above-mentioned data assembly circuit R22, in some cases, may not function, and therefore, the data assembly circuit R22 may not be necessarily required in the present disclosure.

Additionally, since the output data bit representation Data_out and the floating-point number decimal point bit number representation SHIFT_FP that are output by the pre-output processing circuit R21 may be data that is concatenated by a plurality of pieces of data, the data assembly circuit R22 may be adopted to convert or assemble the data to a data form that is required finally. For example, concatenated data may be split, or each part of the data (for example, a significant data part and a sign part) may be assembled.

For example, data of the Data_out may be {0000 0000 0000 0000 0101 0011 0001 1010}, and a sign bit of the data may be {0001}, and at this time, a number that is required to be output is a Fix8, and the data assembly circuit R22 may extract two pieces of final second type data from the above data, which are {0101 0011} and {0001 1010} respectively, and signs of the data are 0 and 1 respectively. Therefore, the data assembly circuit may extract final data from the Data_out.

The first conversion stage L1 of the present disclosure may further receive constraint information, where the constraint information may be used to indicate whether the converter supports a specific standard and/or supports a compiler optimization. The specific standard may be any known or unknown standard that is suitable for the present disclosure, for example, an IEEE754; and the compiler optimization may be, for example, a support of compiler behaviors such as −o0 and −o1.

It needs to be understood that the above description is only for specific embodiments, and these embodiments are only for the sake of description and do not form any limitation on the protection scope of the present disclosure. The data type of the first type data, the data type of the second type data, and the content of the constraint information may be expanded to any extent, and any existing or newly-developed data type in the future may be implemented according to a technical solution of the present disclosure.

In the above, when intermediate data passes through the second conversion stage L2, there may exist multiple states, such as an output of the adder ABS' in FIG. 9*a*, an output of the selector Pdata in FIG. 9*b*, and an output of the pre-output processing circuit Data_out in FIG. 10, FIG. 11*a* and FIG. 11*b*, and the like. These pieces of data (optionally, these pieces of data may be added with other pieces of auxiliary data) may be equal to the second type data. For example, the ABS' may be equal to the second type data, and ABS'+Pdata may be equal to the second type data; similarly, the Pdata may be equal to the second type data, and Pdata+Psign may be equal to the second type data. The difference between the Pdata and the Pdata+Psign lies in the sign bit; for another example, the Data_out may be equal to the second type data, and Data_out+Shift_FP may also be equal to the second type data. It needs to be understood that although these pieces of data of different phrases may be represented by different signs, for some pieces of data, the data may be the same or different; in other words, the "second type data" in the present disclosure may be any of the above data, but the only difference among these pieces of data is the way that these pieces of data are represented in each figure. For example, if an input number is a Fix16 that is a positive number and is expanded to a 32-bit number, and an output number is a Fix32, the Pdata may be distributed as the Data_out to be output directly after passing through the fourth selector (as shown in FIG. 11*a*). Since the data of the Data_out itself is compatible with the form of the Fix32, further processing may not be required, and the data may be output directly as the second type data.

The following will describe the above-mentioned various units, circuits and components in combination with detailed embodiments.

Embodiment 1

Embodiment 1 shows an embodiment of converting a Fix8 to a Float16.

Assuming that input numbers are 81 and 82, and the data type is fix8, and two Fix8 numbers are concatenated, a hexadecimal number that is concatenated by the two numbers is DATA=32'h 00008182 (0000 0000 0000 0000 1000 0001 1000 0010). 32' described above represents 32 bits, and h represents the hexadecimal. The first exponent bit, for example, may be 2.

After concatenation, the first exponent bit may form a 32-bit number; in other words, outputs through the first extracting unit E1 of the first data parsing unit are the followings: the intermediate data bit Mdata is 32'h ff81 ff82; the intermediate exponent bit Mshift is 2, which is equal to an original input; extracted Sign is 0011, where only two numbers are significant, (11, which are signs of 81 and 82 respectively), and invalid positions are 0, and if the significant numbers is two negative numbers, values are 1. In other words, the intermediate sign bit Msign is 0011.

It needs to be understood that the above description is based on the concatenated data as an object, and if taking a piece of single data as the object (for example, 81) and describing actual values (for example, data before the concatenation), the intermediate data bit Mdata is 81, and the intermediate exponent bit Mshift is 2, and the intermediate sign bit Msign is 1.

Here, assuming that the second exponent bit Sshift is 3, a difference value between the first exponent bit and the second exponent bit, which is the difference exponent bit Dshift obtained by subtracting the second exponent bit by the first exponent bit, is −1, and in a case of a 9-bit number, the difference value may be further expressed as 1 1111 1111.

As shown in FIG. 6, FIG. 7*a* and FIG. 7*b*, after calculation, especially after passing through the second calculation unit C2, the following may be obtained:

the second intermediate data bit ABS=32'h 007f 007e, and the data type of the input is the Fix, and the complement may be taken through the selector;

the second intermediate exponent bit EXP=−1 (1 1111 1111), which is equal to the transition exponent bit;

the second intermediate sign bit SIGN=0011 (which is directly equal);

the second intermediate rounding bit STK=32'h 007f 007e (rounding up and rounding down: STK=ABS).

Next, the second intermediate result including the ABS, the EXP, the SIGN, and the STK may be input to the second pre-output parsing unit P2 (as shown in FIG. 6 to FIG. 9*b*).

Through the shift operator P21, since EXP=−1, the EXP may be shifted to the right by one bit to obtain a shift result=32'h 003f 003f.

Through the adder P22, if a number that is used to be summed is STK[−EXP −1]=STK[0] (in other words, the number that is used to be summed is STK[−EXP −1], which is STK[0]), and if the two numbers correspond to STK[16] =1 and STK[0]=0: high 16 bits that are output by the adder are [31:16]=16'h 003f+STK[16]=16'h 0040, and low 16 bits that are output by the adder are [15:0]=16'h 003f+STK[0] =16'h 003f. Therefore, an output of the adder=32'h 0040 003f.

Through the selector P23, obviously, the output of the adder P22 is relatively small, and there is no overflow, which does not include exceptions. Additionally, Pdata=the output of the adder=32'h 0040 003f=0000 0000 0100 0000 0000 0000 0011 1111.

Next, the data may enter the pre-output processing circuit R21, as shown in FIG. 10.

If the type of the output is the Float16, the Pdata may be normalized, and DATA_out=32'h 0000 001f

SHIFT_FP={6-15, 5-15}={−9, −10}={10111, 10110}.

Next, the data may enter the data assembly circuit R22, as shown in FIG. 10.

The SIGN, the SHIFT_FP, and the DATA_out may be assembled as two pieces of Float16-type data.

The second type data={1, 10111, 0000000000, 1, 10110, 0000011111}=32'h dc00 d81f.

Embodiment 2

Embodiment 2 shows an embodiment of converting a Float16 into a Fix8 with a first shift value of {0, 0}.

Assuming that an input DATA=32'h c001 4401 (1100 0000 0000 0001 0100 0100 0000 0001), and the rounding type is rounding toward a positive infinity, as shown in FIG. 4, Mdata=32'h 0401 0401 (0000 0100 0000 0001 0000 0100 0000 0001) (where there are only two significant numbers, where each of them has 11 bits, and other bit numbers are expanded in the sign bit, and since a fp itself is represented by an original code, the sign bit may be filled with 0);

Mshift={16, 17} (10000 10001), and the type of the input is the Float, and several bits in the middle are taken to be directly equal;

Msign=0010 (where only two numbers are significant and invalid positions are 0, and since two significant numbers include one negative number and one positive number, the two significant numbers may be set as 10).

As shown in FIG. 6, a second shift value is (3,3), and after calculation, especially after passing through the second calculation unit C2, the following may be obtained:

ABS=32'h 0401 0401, and the data type of the input is the Float, and ABS=Mdata may be output directly in the form of the original code.

EXP={16−15−(3), 17−15−(3)}={−2, −1} (where the type of the input is the Float, and a shift code −15 may be taken first and then a difference between the shift code −15 and the second shift value may be taken)={11110 11111}.

SIGN=0010 (which is directly equal).

STK=32'h 0000 ffff. When rounding toward a positive infinity, in this example, if data representation bit numbers are ABS[31:16] and ABS[15:0], STK[n]=|ABS[n:x1] && ~SIGN, where x2>=n>=x1. For the high 16 bits of the 32-bit number, x2=31, and x1=16; for the low 16 bits of the 32-bit number, x2=15, and x1=0.

Next, the intermediate result including the ABS, the EXP, the SIGN, and the STK may be input to the second pre-output parsing unit P2 (as shown in FIG. 6 to FIG. 9*b*).

Through the shift operator P21, since EXP={−2, −1}, the EXP may be shifted to the right by 2 bits and 1 bit respectively to obtain a shift result=32'h 0008 0010.

Through the adder P22, if the number that is used to be summed is STK[−EXP −1]=STK[2],STK[1], and if the two numbers correspond to STK[18]=0, STK[1]=1: high 16 bits that are output by the adder are [31:16]=16'h 0008+STK [18]=16'h 0008, and low 16 bits that are output by the adder are [15:0]=16'h 0010+STK[1]=16'h 0011. Therefore, an output of the adder=32'h 0008 0011.

Through the selector P23, obviously, the output of the adder is relatively small, and there is no overflow, which does not include exceptions. Additionally, Pdata=the output of the adder=32'h 0008 0011=0000 0000 0000 1000 0000 0000 0001 0001.

Next, the data may enter the pre-output processing circuit R21, as shown in FIG. 10.

If the type of the output is the Fix, the Pdata may be represented by taking the complement, and DATA_out=32'h fff8 0011.

Next, the data may enter the data assembly circuit R22, as shown in FIG. 10.

The DATA_out obtained may be converted into two pieces of Fix8-type data and may be placed on low bits, and invalid numbers of high 16 bits may be set as zeros.

The second type data=32'h 0000 f811 may be obtained.

Based on the aforementioned devices, the present disclosure provides a method, as shown in FIG. 2, and other operations and steps of the method of the present disclosure may not be shown in the drawings for the sake of simplicity. The operations of the method of the present disclosure may be based on specific devices, units and circuits that are recorded in the present disclosure, or based on other software, hardware, and firmware, which is not limited to the aforementioned detailed structures.

An aspect of the present disclosure provides an electronic device, including: one or more processors; and a memory, where the memory stores computer-executable instructions, and when the computer-executable instructions are executed by the one or more processors, the electronic device performs the above-mentioned method.

An aspect of the present disclosure provides a computer-readable storage medium, including computer-executable instructions, where when the computer-executable instructions are executed by one or more processors, the above-mentioned method is performed.

In traditional actual calculations, there are few conversion types and few constraints in the data type conversion. Most of them may be completed in less clock cycles with simple software behaviors and instructions. More importantly, frequency of data type conversion instructions is very low.

However, in artificial intelligence chips, since there are different requirements for precision, a requirement for the data type conversion is likely to occur in the calculation of each step, and once the requirement occurs, not a small number of calculations are required, but very intensive large-scale calculations are required, and the data organization of the calculations is very regular. If a traditional data type conversion method is used, the intensive large-scale calculations may have a large memory access delay. Since the frequency of data type conversion instructions is relatively high, this bottleneck may affect overall calculation performance of a processor core.

Additionally, a simple stacking of conversion number instructions may cause a large amount of logic redundancy in a conversion number unit, resulting in an excessively large local area and a dense wiring, which may affect local performance of a processor. The following will explain the problem of logic redundancy with an example: during a data type conversion process of converting a Fix4 to a fp16, the Fix4 may be required to be converted into an absolute value form, and the rounding bit may be calculated based on the absolute value form, and in a final phrase of the data conversion, the same numerical data may be represented by fixed points and may be converted into data that is represented by floating-point number 10-bit mantissas in a normal or denormal form, and the concatenation of the output number may be completed finally by the sign bit, the exponent, and the mantissa. Actually, in the process of converting the Fix4 to the fp16, an exact same first half of logic is required: the Fix4 may be converted into the absolute value form, and the rounding bit may be calculated based on the absolute value form; when the Fix8 is converted to the fp16, an exact same second half of logic is required: the same numerical data may be represented by the fixed points and may be converted into the data that is represented by the floating-point number 10-bit mantissas in the normal or denormal form, and the concatenation of the output number may be completed finally by the sign bit, the exponent, and the mantissa. If an instruction set is simply expanded, there may be a lot of hardware operations with repeated logic and repeated calculations (if complier behavior software is used to control the calculation of this part of logic, redundant calculations of this part may not disappear, and the repeated calculations may be performed in software implementations), and the performance of the processor may be affected.

The main purpose of this structure design of the intermediate result of the present disclosure is to reduce repeated calculation logic and compared with the software implementations, reduce a memory access delay and overheads, and simultaneously have better scalability and portability. For example, as long as an intermediate result that may represent any data type is obtained, flexible processing may be performed on the intermediate result, and it is not necessarily required to employ specific circuits and structures described in the present disclosure. The content of the present disclosure may be ported to other processing units easily, for example, a traditional central processing unit (CPU) and a traditional graphics processing unit (GPU).

In the aforementioned embodiments of the present disclosure, the description of each embodiment has its own emphasis. A part that is not described in detail in one embodiment may be described with reference to related descriptions in other embodiments. Each technical feature of the embodiments above may be randomly combined. For the sake of conciseness, not all possible combinations of technical features of the embodiments above are described. Yet, provided that there is no contradiction, combinations of these technical features fall within the scope of the description of the present specification.

The present disclosure also provides a combined processing apparatus 1200, including the above-mentioned calculation apparatus 1202, a general interconnection interface 1204, and other processing apparatus 1206. The calculation apparatus of the present disclosure interacts with other processing apparatus to jointly complete operations specified by users. FIG. 12 is a schematic diagram of a combined processing apparatus.

Other processing apparatus may include at least one or more than one of general-purpose/special-purpose processors such as a central processing unit (CPU), a graphics processing unit (GPU), a neural network processor, and the like. A count of processors included in other processing apparatus is not limited herein. Other processing apparatus may serve as an interface that connects a machine learning computation apparatus to external data and control, including data moving, and may perform basic controls of the machine learning computation apparatus, such as starting and stopping the machine learning computation apparatus. Additionally, other processing apparatus may also cooperate with the machine learning computation apparatus to complete computation tasks.

The general interconnection interface may be configured to transfer data and control instructions between a calculation apparatus (including, for example, the machine learning computation apparatus) and other processing apparatus. The calculation apparatus may obtain input data required from other processing apparatus and write the data in an on-chip storage apparatus of the calculation apparatus. The calculation apparatus may also obtain the control instructions from other processing apparatus and write the control instructions in an on-chip control caching unit of the calculation apparatus. Additionally, the calculation apparatus may further read data stored in a storage unit of the calculation apparatus and transfer the data to other processing apparatus.

Optionally, the structure may further include a storage apparatus 1208. The storage apparatus may be connected to the computation apparatus and other processing apparatus respectively. The storage apparatus may be configured to store data of the calculation apparatus and other processing apparatus. The storage apparatus may be especially suitable for storing data whose data that is required to be computed may not be completely stored in the internal storage of the calculation apparatus or other processing apparatus of the present disclosure.

The combined processing apparatus may be used as a system on chip (SOC) of a device including a mobile phone, a robot, a drone, a video surveillance device, and the like, which may effectively reduce the core area of a control part, increase processing speed, and reduce overall power consumption. In this case, the general interconnection interface of the combined processing apparatus may be connected to some components of the device. The some components include, for example, a webcam, a monitor, a mouse, a keyboard, a network card, and a WIFI interface.

In some embodiments, the present disclosure also provides a chip, including the above-mentioned calculation apparatus or the combined processing apparatus.

In some embodiments, the present disclosure also provides a chip package structure, including the above-mentioned chip.

In some embodiments, the present disclosure also provides a board card, including the above-mentioned chip package structure. Referring to FIG. 13, FIG. 13 shows an exemplary board card. The above-mentioned board card, other than the above-mentioned chip 1302, may further include other supporting components, where the supporting components include but are not limited to: a storage component 1304, an interface apparatus 1306, and a control component 1308.

The storage component may be connected to a chip in a chip package structure through a bus, and the storage component is used for storing data. The storage component may include a plurality of groups of storage units 1310. Each group of the storage units may be connected to the chip through the bus. It may be understood that each group of the storage units may be a double data rate (DDR) synchronous dynamic random access memory (SDRAM).

The DDR may double the speed of the SDRAM without increasing clock frequency. The DDR may allow data to be read on rising and falling edges of a clock pulse. The speed of the DDR is twice that of a standard SDRAM. In an embodiment, a storage apparatus may include 4 groups of storage units. Each group of storage units may include a plurality of DDR4 particles (chips). In an example, four 72-bit DDR4 controllers may be arranged inside the chip, where 64 bits of each 72-bit DDR4 controller are used for data transfer and 8 bits are used for an error checking and correcting (ECC) parity. In an embodiment, each group of the storage units may include a plurality of DDR SDRAMs arranged in parallel. The DDR may transfer data twice in one clock cycle. A controller for controlling the DDR may be arranged in the chip to control data transfer and data storage of each storage unit.

The interface apparatus may be electrically connected to the chip in the chip package structure. The interface apparatus may be configured to implement data transfer between the chip and an external device 1312 (such as a server or a computer). For example, in an embodiment, the interface apparatus may be a standard peripheral component interconnect express (PCIe) interface. For example, to-be-processed data may be transferred from the server to the chip through the standard PCIe interface to realize data transfer. In another embodiment, the interface apparatus may also be other interfaces. Specific representations of other interfaces are not limited in the present disclosure, as long as an interface unit may realize a switching function. Additionally, a calculation result of the chip is still sent back to the external device (such as the server) by the interface apparatus.

The control component may be electrically connected to the chip. The control component may be configured to monitor a state of the chip. Specifically, the chip and the control component may be electrically connected through a serial peripheral interface (SPI). The control component may include a micro controller unit (MCU). If the chip may include a plurality of processing chips, a plurality of processing cores, or a plurality of processing circuits, the chip may be capable of driving a plurality of loads. Therefore, the chip may be in different working states, such as a multi-load state and a light-load state. Through the control apparatus, regulation and control of working states of the plurality of processing chips, the plurality of processing cores and/or the plurality of processing circuits in the chip may be realized.

In some embodiments, the present disclosure also provides an electronic device or apparatus, including the above-mentioned board card.

The electronic device or apparatus may include a data processing apparatus, a robot, a computer, a printer, a scanner, a tablet, a smart terminal, a mobile phone, a traffic recorder, a navigator, a sensor, a webcam, a server, a cloud-based server, a camera, a video camera, a projector, a watch, a headphone, a mobile storage, a wearable device, a vehicle, a household appliance, and/or a medical device.

The vehicle may include an airplane, a ship, and/or a car. The household appliance may include a television, an air conditioner, a microwave oven, a refrigerator, an electric rice cooker, a humidifier, a washing machine, an electric lamp, a gas cooker, and a range hood. The medical device may include a nuclear magnetic resonance spectrometer, a B-ultrasonic scanner, and/or an electrocardiograph.

The foregoing may be better understood according to the following articles.

Article A1. A converter for data type conversion, comprising: a first conversion stage (L1) configured to receive first type data and first descriptive information about the first type data, and according to the first descriptive information, convert the first type data into an intermediate result; and a second conversion stage (L2) configured to receive second descriptive information about second type data, and according to the second descriptive information, convert the intermediate result into the second type data.

Article A2. The converter of article A1, where the first conversion stage (L1) includes a first receiving unit (Rx1) and a first extracting unit (E1), and the first descriptive information includes a first data type of the first type data and a first exponent bit of the first type data, where the first receiving unit (Rx1) is configured to receive the first type data and the first descriptive information; and the first extracting unit (E1) is configured to, from the first type data and the first descriptive information, extract an intermediate sign bit (Msign), an intermediate data bit (Mdata), and an intermediate exponent bit (Mshift) as the intermediate result.

Article A3. The converter of article A1 or A2, where the first extracting unit (E1) includes: a sign bit calculation circuit (E11), a significant bit calculation circuit (E12), and an intermediate exponent bit calculation circuit (E13), where the sign bit calculation circuit (E11) is configured to, from the first type data, extract a sign of the first type data as the intermediate sign bit (Msign); the significant bit calculation circuit (E12) is configured to, from the first type data, extract a significant data bit of the first type data as the intermediate data bit (Mdata); and the intermediate exponent bit calculation circuit (E13) is configured to, according to the first type data or a first exponent bit, obtain exponent information of the first type data as the intermediate exponent bit (Mshift).

Article A4. The converter of any one of articles A1-A3, further comprising a memory configured to store the intermediate result.

Article A5. The converter of any one of articles A1-A4, where the second conversion stage (L2) includes a second calculation unit (C2), a second pre-output parsing unit (P2), and a second data recovery unit (R2), where the second calculation unit (C2) is configured to receive the intermediate result and the second descriptive information, and according to the intermediate result and the second descriptive information, calculate a second intermediate result; the second pre-output parsing unit (P2) is configured to calculate a pre-output data bit (Pdata) and a pre-output sign bit (Psign) according to the second intermediate result; and the second data recovery unit (R2) is configured to generate the second type data according to the pre-output data bit (Pdata) and the pre-output sign bit (Psign).

Article A6. The converter of any one of articles A1-A5, where the second descriptive information includes a second data type of the second type data and a second exponent bit (Sshift) of the second type data, and the second calculation unit (C2) includes: an absolute value calculation circuit (C21) configured to calculate a second intermediate data bit (ABS) according to the intermediate data bit (Mdata);

a sign bit calculation circuit (C22) configured to calculate a second intermediate sign bit (Sign) according to the intermediate sign bit (Msign); and a difference exponent bit calculation circuit (C23) configured to calculate a difference exponent bit (Dshift) between the intermediate exponent bit (Mshift) and the second exponent bit (Sshift) as a second intermediate exponent bit (EXP).

Article A7. The converter of any one of article A1-A6, where the second calculation unit (C2) further includes: a rounding bit calculation circuit (C24) configured to calculate a second intermediate rounding bit (STK) according to the second intermediate data bit (ABS) and the second intermediate sign bit (Sign).

Article A8. The converter of any one of articles A1-A7, where the second calculation unit (C2) further includes: the rounding bit calculation circuit (C24) configured to calculate the second intermediate rounding bit (STK) according to the second intermediate data bit (ABS), the second intermediate exponent bit (EXP), and the second intermediate sign bit (Sign).

Article A9. The converter of any one of articles A1-A8, where the absolute value calculation circuit (C21) includes: a second selector configured to judge whether the intermediate data bit (Mdata) is less than 0; and a first complement calculator configured to calculate a complement of the intermediate data bit (Mdata) as the second intermediate data bit (ABS) if the intermediate data bit (Mdata) is less than 0, otherwise, take the intermediate data bit (Mdata) as the second intermediate data bit (ABS).

Article A10. The converter of any one of articles A1-A9, where the absolute value calculation circuit (C21) further includes a first selector and a first normalizer, where the first selector is configured to judge whether a data type of the intermediate data bit (Mdata) is a first type or a second type; if the data type of the intermediate data bit (Mdata) is the first type, the first selector selects the second selector for processing; if the data type of the intermediate data bit (Mdata) is the second type, the first selector selects the first normalizer for processing; and the first normalizer is configured to normalize the intermediate data bit (Mdata) as the second intermediate data bit (ABS) if the data type of the intermediate data bit (Mdata) is the second type.

Article A11. The converter of any one of articles A1-A10, where the sign bit calculation circuit (C22) is a straight connection line.

Article A12. The converter of any one of articles A1-A11, where the second pre-output parsing unit (P2) includes: the rounding bit calculation circuit (C24) configured to calculate the second intermediate rounding bit (STK) according to the second intermediate data bit (ABS), the second intermediate exponent bit (EXP), and the second intermediate sign bit (Sign).

Article A13. The converter of any one of articles A1-A12, where the rounding bit calculation circuit (C24) is implemented by an and-or logic.

Article A14. The converter of any one of articles A1-A13, where the second pre-output parsing unit (P2) is configured to calculate the pre-output data bit (Pdata) and the pre-output sign bit (Psign) according to the second intermediate data bit (ABS), the second intermediate sign bit (Sign), the second intermediate exponent bit (EXP), and the second intermediate rounding bit (STK).

Article A15. The converter of any one of articles A1-A14, where a second pre-output parsing unit (P2) includes: a shift operator (P21) and an adder (P22), and the second pre-output parsing unit (P2) is configured to generate a temporary output data bit (ABS') and the pre-output sign bit (Psign), where the shift operator (P21) is configured to shift the second intermediate data bit (ABS) by the second intermediate exponent bit (EXP) to obtain a shift result; the adder (P22) is configured to generate a temporary data bit (ABS') according to the shift result and the second intermediate rounding bit (STK); and the pre-output sign bit (Psign) is equal to the second intermediate sign bit (Sign).

Article A16. The converter of any one of articles A1-A15, where the pre-output parsing unit (P2) further includes a selector (P23), where the selector (P23) is configured to detect whether the temporary data bit (ABS') is greater than a saturation value; if the temporary data bit (ABS') is greater than the saturation value, the selector (P23) performs saturation processing on the temporary data bit (ABS') to obtain the pre-output data bit (Pdata); and if the temporary data bit (ABS') is not greater than the saturation value, the selector (P23) outputs the temporary data bit (ABS') as the pre-output data bit (Pdata).

Article A17. The converter of any one of articles A1-A16, where the second data recovery unit (R2) includes a pre-output processing circuit (R21) and a data assembly circuit (R22), where the pre-output processing circuit (R21) is configured to receive the pre-output data bit (Pdata) and the pre-output sign bit (Psign) to generate an output data bit representation (Data_out); and the data assembly circuit (R22) is configured to generate the second type data according to the output data bit representation (Data_out) and the pre-output sign bit (Psign).

Article A18. The converter of any one of articles A1-A17, where the pre-output processing circuit (R21) is further configured to generate a floating-point number decimal point bit representation (SHIFT_FP), and the data assembly circuit (R22) is configured to generate the second type data according to a data output bit representation (Data_out), a floating-point number decimal point bit number representation (Shift_FP), and the pre-output sign bit (Psign).

Article A19. The converter of any one of articles A1-A18, where the pre-output processing circuit (R21) includes: a fourth selector and a second complement calculator, where the fourth selector is configured to receive the pre-output data bit (Pdata) and the pre-output sign bit (Psign), where if the pre-output sign bit (Psign) is a negative number, the fourth selector outputs the pre-output data bit to the second complement calculator, and if the pre-output sign bit (Psign) is a positive number or is not the negative number, the fourth selector outputs the pre-output data bit as the data output bit representation (Data_out); and the second complement calculator is configured to calculate a complement for the pre-output data bit (Pdata).

Article A20. The converter of any one of articles A1-A19, where the pre-output processing circuit (R21) further includes: a third selector, a second normalizer, and a floating-point number decimal point location determinator, where the third selector is configured to receive the pre-output data bit (Pdata) and judge whether a data type of the pre-output data bit (Pdata) is the first type or the second type, where if the data type of the pre-output data bit (Pdata) is the first type, the third selector sends the pre-output data bit (Pdata) to the fourth selector, and if the data type of the pre-output data bit (Pdata) is the second type, the third selector sends the pre-output data bit (Pdata) to the second normalizer; the second normalizer is configured to normalize the pre-output data bit (Pdata) and output a normalized pre-output data bit (Pdata) as the data output bit representation (Data out); and the floating-point number decimal point location determinator is configured to determine the floating-point number decimal point bit number representation (SHIFT_FP) according to an output of the second normalizer.

Article A21. The converter of any one of articles A1-A20, where the first conversion stage (L1) is further configured to determine the number of first type data received and concatenate the first type data to form first concatenation data, and the first conversion stage (L1) converts the first concatenation data into the intermediate result according to the first descriptive information.

Article A22. The converter of any one of articles A1-A21, where the number of intermediate results received is determined by: dividing the number of bits of the first type data by the number of processing bits of the converter, or a preset first fixed value.

Article A23. The converter of any one of articles A1-A22, where the first conversion stage (L1) is further configured to determine the number of to-be-split first type data received and split the first type data into split data with the same number, and the first conversion stage (L1) converts the split data into the intermediate result according to the first descriptive information.

Article A24. The converter of any one of articles A1-A23, where the number of to-be-split intermediate results received is determined by: dividing the number of processing bits of the converter by the number of bits of the first type data, or a preset second fixed value.

Article A25. The converter of any one of articles A1-A24, where the first conversion stage (L1) and/or the second conversion stage (L2) is further configured to receive constraint information, where the constraint information is used to indicate whether a specific standard is supported, and/or a compiler optimization is supported.

Article A26. The converter of any one of articles A1-A25, where the data type of the first type data and the data type of the second type data are scalable.

Article A27. A chip, comprising the converter of any one of articles A1-A26.

Article A28. A calculation apparatus, comprising the converter of any one of articles A1-A26 or the chip of article A27.

Article 29. A method for data type conversion, comprising: receiving first type data and first descriptive information about the first type data, and according to the first descriptive information, converting the first type data into an intermediate result; and receiving second descriptive information about second type data, and according to the second descriptive information, converting the intermediate result into the second type data.

Article A30. The method of article A29, where the first descriptive information includes a first data type of the first type data and a first exponent bit of the first type data, and receiving the first type data and the first descriptive information about the first type data and according to the first descriptive information, converting the first type data into the intermediate result include: receiving the first type data and the first descriptive information; and from the first type data and the first descriptive information, extracting an intermediate sign bit (Msign), an intermediate data bit (Mdata), and an intermediate exponent bit (Mshift) as the intermediate result.

Article A31. The method of article A29 or article A30, where from the first type data and the first descriptive information, extracting the intermediate sign bit (Msign), the intermediate data bit (Mdata), and the intermediate exponent bit (Mshift) as the intermediate result includes: from the first type data, extracting a sign of the first type data as the intermediate sign bit (Msign); from the first type data, extracting a significant data bit of the first type data as the intermediate data bit (Mdata); and according to the first type data or a first exponent bit, obtaining exponent information of the first type data as the intermediate exponent bit (Mshift).

Article A32. The method of any one of articles A29-A31, further comprising storing the intermediate result in a memory.

Article A33. The method of article A31, where receiving the second descriptive information about the second type data and according to the second descriptive information, converting the intermediate result into the second type data include: receiving the intermediate result and the second descriptive information and according to the intermediate result and the second descriptive information, calculating a second intermediate result; calculating a pre-output data bit (Pdata) and a pre-output sign bit (Psign) according to the second intermediate result; and generating the second type data according to the pre-output data bit (Pdata) and the pre-output sign bit (Psign).

Article A34. The method of article A33, where the second descriptive information includes a second data type of the second data type and a second exponent bit (Sshift) of the second type data, and according to the intermediate result and the second descriptive information, calculating the second intermediate result includes: calculating a second intermediate data bit (ABS) according to the intermediate data bit (Mdata); calculating a second intermediate sign bit (Sign) according to the intermediate sign bit (Msign); and calculating a difference exponent bit (Dshift) between the intermediate exponent bit (Mshift) and the second exponent bit (Sshift) as a second intermediate exponent bit (EXP).

Article A35. The method of article A34, where according to the intermediate result and the second descriptive information, calculating the second intermediate result further includes: calculating a second intermediate rounding bit (STK) according to the second intermediate data bit (ABS) and the second intermediate sign bit (Sign).

Article A36. The method of article A34, where according to the intermediate result and the second descriptive information, calculating the second intermediate result further includes: a rounding bit calculation circuit (C24) configured to calculate a second intermediate rounding bit (STK) according to the second intermediate data bit (ABS), the second intermediate exponent bit (EXP), and the second intermediate sign bit (Sign).

Article A37. The method of any one of articles A34-A36, where calculating the second intermediate data bit (ABS) according to the intermediate data bit (Mdata) includes: judging whether the intermediate data bit (Mdata) is less than 0; and calculating a complement of the intermediate data bit (Mdata) as the second intermediate data bit (ABS) if the intermediate data bit (Mdata) is less than 0, otherwise, taking the intermediate data bit (Mdata) as the intermediate data bit (ABS).

Article A38. The method of article A37, where calculating the second intermediate data bit (ABS) according to the intermediate data bit (Mdata) further includes: judging whether a data type of the intermediate data bit (Mdata) is a first type or a second type; if the data type of the intermediate data bit (Mdata) is the first type, judging whether the intermediate data bit (Mdata) is less than 0; if the intermediate data bit (Mdata) is less than 0, calculating the complement of the intermediate data bit (Mdata) as the second intermediate data bit (ABS), otherwise, taking the intermediate data bit (Mdata) as the second intermediate data bit (ABS); and if the data type of the intermediate data bit (Mdata) is the second type, normalizing the intermediate data bit (Mdata) as the second intermediate data bit (ABS).

Article A39. The method of article A38, where calculating the pre-output data bit (Pdata) and the pre-output sign bit (Psign) according to the second intermediate result includes: calculating the second intermediate rounding bit (STK) according to the second intermediate data bit (ABS), the second intermediate exponent bit (EXP), and the second intermediate sign bit (Sign).

Article A40. The method of article A35, A36 or A39, where calculating the second intermediate rounding bit (STK) is implemented by an and-or logic.

Article A41. The method of article A35, A36 or A39, where calculating the pre-output data bit (Pdata) and the pre-output sign bit (Psign) according to the second intermediate result includes: calculating the pre-output data bit (Pdata) and the pre-output sign bit (Psign) according to the second intermediate data bit (ABS), the second intermediate sign bit (Sign), the second intermediate exponent bit (EXP), and the second intermediate rounding bit (STK).

Article A42. The method of article A41, where calculating the pre-output data bit (Pdata) and the pre-output sign bit (Psign) according to the second intermediate result includes: shifting the second intermediate data bit (ABS) by the second intermediate exponent bit (EXP) to obtain a shift result; and generating a temporary data bit (ABS') according to the shift result and the second intermediate rounding bit (STK), where the pre-output sign bit (Psign) is equal to the second intermediate sign bit (Sign).

Article A43. The method of article A42, where calculating the pre-output data bit (Pdata) and the pre-output sign bit (Psign) according to the second intermediate result further includes: detecting whether the temporary data bit (ABS') is greater than a saturation value; if the temporary data bit (ABS') is greater than the saturation value, performing saturation processing on the temporary data bit (ABS') to obtain the pre-output data bit (Pdata); and if the temporary data bit (ABS') is not greater than the saturation value, outputting the temporary data bit (ABS') as the pre-output data bit (Pdata).

Article A44. The method of any one of articles A41-A43, where generating the second type data according to the pre-output data bit (Pdata) and the pre-output sign bit (Psign) includes: receiving the pre-output data bit (Pdata) and the pre-output sign bit (Psign) to generate an output data bit representation (Data_out); and generating the second type data according to the output data bit representation (Data_out) and the pre-output sign bit (Psign).

Article A45. The method of article A44, where receiving the pre-output data bit (Pdata) and the pre-output sign bit (Psign) to generate the output data bit representation (Data_out) further includes: generating a floating-point number decimal point bit representation (SHIFT_FP); and generating the second type data according to the output data bit representation (Data_out) and the pre-output sign bit (Psign) includes: generating the second type data according to a data output bit representation (Data_out), a floating-point number decimal point bit number representation (Shift FP), and the pre-output sign bit (Psign).

Article A46. The method of article A44 or article A45, where receiving the pre-output data bit (Pdata) and the pre-output sign bit (Psign) to generate the output data bit representation (Data_out) includes: receiving the pre-output data bit (Pdata) and the pre-output sign bit (Psign); if the pre-output sign bit (Psign) is a negative number, calculating a complement for the the pre-output data bit (Pdata); and if the pre-output sign bit (Psign) is a positive number or is not the negative number, outputting the pre-output data bit (Psign) as the data output bit representation (Data_out).

Article A47. The method of article A46, where receiving the pre-output data bit (Pdata) and the pre-output sign bit (Psign) to generate the output data bit representation (Data_out) further includes: receiving the pre-output data bit (Pdata) and judging whether a data type of the pre-output data bit (Pdata) is the first type or the second type; and if the data type of the pre-output data bit (Pdata) is the first type, and if the pre-output sign bit (Psign) is the negative number, calculating the complement for the pre-output data bit (Pdata); and if the pre-output data bit (Pdata) is the positive number and is not the negative number, outputting the pre-output data bit (Psign) as the data output bit representation (Data_out); if the data type of the pre-output data bit (Pdata) is the second type, normalizing the pre-output data bit (Pdata) and outputting a normalized pre-output data bit (Pdata) as the data output bit representation (Data_out); and determining the floating-point number decimal point bit number representation (SHIFT_FP) according to an output of a normalizer.

Article A48. The method of any one of articles A29-A47, where receiving the first type data and the first descriptive information about the first type data and according to the first descriptive information, converting the first type data into the intermediate result further include: determining the number of first type data received and concatenating the first type data to form first concatenation data, and according to the first descriptive information, converting the first concatenation data into the intermediate result.

Article A49. The method of any one of articles A48, where the number of intermediate results received is determined by: dividing the number of bits of the first type data by the number of processing bits of the converter of any one of articles A1-A26, or a preset first fixed value.

Article A50. The method of any one of articles A29-A47, where receiving the first type data and the first descriptive information about the first type data and according to the first descriptive information, converting the first type data into the intermediate result further include: determining the number of to-be-split first type data received and splitting the first type data into split data with the same number, and according to the first descriptive information, converting the split data into the intermediate result.

Article A51. The method of article A50, where the number of to-be-split intermediate results received is determined by: dividing the number of processing bits of the converter of any one of articles A1-A26 by the number of bits of the first type data, or a preset second fixed value.

Article A52. The method of any one of articles A29-A51, further comprising: receiving constraint information, where the constraint information is used to indicate whether a specific standard is supported, and/or a compiler optimization is supported.

Article A53. The method of any one of articles A29-A52, where the data type of the first type data and the data type of the second type data are scalable.

Article A54. An electronic device, comprising: one or more processors; a memory, where the memory stores computer-executable instructions, and when the computer-executable instructions are executed by the one or more processors, the electronic device performs the method of any one of articles A29-A53.

Article A55. A computer-readable storage medium, including computer-executable instructions, where when the computer-executable instructions are executed by one or more processors, the method of any one of articles A29-A53 is performed.

It needs to be noted that for the sake of conciseness, the foregoing method embodiments are all described as a series of combinations of actions, but those skilled in the art should know that the present disclosure is not limited by the described order of action since steps may be performed in a different order or simultaneously according to the present disclosure. Secondly, those skilled in the art should also understand that the embodiments described in the specification are all optional, and actions and modules involved are not necessarily required for this present disclosure.

In the embodiments above, the description of each embodiment has its own emphasis. For a part that is not described in detail in one embodiment, reference may be made to related descriptions in other embodiments.

In several embodiments provided in this disclosure, it should be understood that the disclosed apparatus may be implemented in other ways. For instance, the apparatus embodiments described above are merely illustrative. For instance, a division of units is only a logical function division. In an actual implementation, there may be other manners for the division. For instance, a plurality of units or components may be combined or may be integrated in another system, or some features may be ignored or may not be performed. Additionally, the displayed or discussed mutual coupling or direct coupling or communication connection may be implemented through indirect coupling or communication connection of some interfaces, apparatuses or units, and may be in electrical, optical, acoustic, magnetic or other forms.

The units described as separate components may or may not be physically separated. The components shown as units may or may not be physical units. In other words, the components may be located in one place, or may be distributed to a plurality of network units. According to certain needs, some or all of the units may be selected for realizing purposes of the embodiments of the present disclosure.

Additionally, functional units in each embodiment of the present application may be integrated into one processing unit, or each of the units may exist separately and physically, or two or more units may be integrated into one unit. The integrated units above may be implemented in the form of hardware or in the form of a software program module.

If the integrated units are implemented in the form of the software program module and sold or used as an independent product, the integrated units may be stored in a computer-readable memory. Based on such understanding, if a technical solution of the present disclosure may be embodied in the form of a software product, the software product may be stored in a memory, and the software product may include several instructions to enable a computer device (which may be a personal computer, a server, or a network device, and the like) to perform all or part of steps of the method of the embodiments of the present disclosure. The foregoing memory may include: a USB flash drive, a read-only memory (ROM), a random access memory (RAM), a mobile hard disk, a magnetic disk, or an optical disc, and other media that may store a program code.

It should be understood that terms such as "first", "second", "third", and "fourth" appear in the claims, the specification, and drawings are used for distinguishing different objects rather than describing a specific order. It should be understood that terms "including" and "comprising" used in the specification and the claims indicate the presence of a feature, an entity, a step, an operation, an element, and/or a component, but do not exclude the existence or addition of one or more other features, entities, steps, operations, elements, components, and/or collections thereof.

It should also be understood that terms used in the specification of the present disclosure are merely intended to describe a specific embodiment rather than to limit the present disclosure. As being used in the specification and the claims of the present disclosure, unless the context clearly indicates otherwise, singular forms such as "a", "an", and "the" are intended to include plural forms thereof. It should further be understood that a term "and/or" used in the specification and the claims refers to any and all possible combinations of one or more of relevant listed items and includes these combinations.

As being used in this specification and the claims, a term "if" may be interpreted as "when", or "once" or "in response to a determination" or "in response to a case where something is detected" depending on the context. Similarly, depending on the context, a clause "if it is determined that" or a clause "if [a described condition or event] is detected" may be interpreted as "once it is determined that", or "in response to a determination", or "once [a described condition or event] is detected", or "in response to a case where [a described condition or event] is detected".

The above has described the embodiments of the present disclosure in detail. Specific examples have been used in the present disclosure to explain the principles and implementations of the present disclosure. The descriptions of the above embodiments are only used to facilitate understanding of the method and core ideas of the present disclosure. Simultaneously, persons of ordinary skill in the art may change or transform the specific implementations and application scope of the present disclosure according to the ideas of the present disclosure. In summary, the content of this specification should not be construed as a limitation on the present disclosure.

What is claimed:

1. A converter for data type conversion, comprising:

a first conversion stage (L1) configured to receive first type data and first descriptive information about the first type data, and according to the first descriptive information convert the first type data into an intermediate result; and a second conversion stage (L2) configured to receive second descriptive information about second type data, and according to the second descriptive information, convert the intermediate result into the second type data, wherein the first conversion stage (L1) includes a first receiving unit (Rx1) and a first extracting unit (E1), and the first descriptive information includes a first data type of the first type data and a first exponent bit of the first type data, wherein the first receiving unit (Rx1) is configured to receive the first type data and the first descriptive information; and the first extracting unit (E1) is configured to, from the first type data and the first descriptive information, extract an intermediate sign bit (Msign), an intermediate data bit (Mdata), and an intermediate exponent bit (Mshift) as the intermediate result, wherein the second conversion stage (L2) includes a second calculation unit (C2), a second pre-output parsing unit (P2), and a second data recovery unit (R2), wherein the second calculation unit (C2) is configured to receive the intermediate result and the second descriptive information, and according to the intermediate result and the second descriptive information, calculate a second intermediate result;

the second pre-output parsing unit (P2) is configured to calculate a pre-output data bit (Pdata) and a pre-output sign bit (Psign) according to the second intermediate result; and the second data recovery unit (R2) is configured to generate the second type data according to the pre-output data bit (Pdata) and the pre-output sign bit (Psign).

2. The converter of claim 1, wherein the second descriptive information includes a second data type of the second type data and a second exponent bit (Sshift) of the second type data, and the second calculation unit (C2) includes:

an absolute value calculation circuit (C21) configured to calculate a second intermediate data bit (ABS) according to the intermediate data bit (Mdata);

a sign bit calculation circuit (C22) configured to calculate a second intermediate sign bit (Sign) according to the intermediate sign bit (Msign); and a difference exponent bit calculation circuit (C23) configured to calculate a difference exponent bit (Dshift) between the intermediate exponent bit (Mshift) and the second exponent bit (Sshift) as a second intermediate exponent bit (EXP).

3. The converter of claim 2, wherein the second calculation unit (C2) further includes:

a rounding bit calculation circuit (C24) configured to calculate a second intermediate rounding bit (STK) according to the second intermediate data bit (ABS) and the second intermediate sign bit (Sign).

4. The converter of claim 3, wherein the rounding bit calculation circuit (C24) is implemented by an AND-OR logic.

5. The converter of claim 3, wherein the second pre-output parsing unit (P2) is configured to calculate the pre-output data bit (Pdata) and the pre-output sign bit (Psign) according to the second intermediate data bit (ABS), the second intermediate sign bit (Sign), the second intermediate exponent bit (EXP), and the second intermediate rounding bit (STK).

6. The converter of claim 5, wherein the second pre-output parsing unit (P2) includes: a shift operator (P21) and an adder (P22), and the second pre-output parsing unit (P2) is configured to generate a temporary output data bit (ABS') and the pre-output sign bit (Psign), wherein the shift operator (P21) is configured to shift the second intermediate data bit (ABS) by the second intermediate exponent bit (EXP) to obtain a shift result;

the adder (P22) is configured to generate the temporary output data bit (ABS') according to the shift result and the second intermediate rounding bit (STK); and the pre-output sign bit (Psign) is equal to the second intermediate sign bit (Sign).

7. The converter of claim 6, wherein the pre-output parsing unit (P2) further includes a selector (P23), wherein the selector (P23) is configured to detect whether the temporary output data bit (ABS') is greater than a saturation value, if the temporary output data bit (ABS') is greater than the saturation value, the selector (P23) performs saturation processing on the temporary output data bit (ABS') to obtain the pre-output data bit (Pdata); and if the temporary output data bit (ABS') is not greater than the saturation value, the selector (P23) outputs the temporary output data bit (ABS') as the pre-output data bit (Pdata).

8. The converter of claim 5, wherein the second data recovery unit (R2) includes a pre-output processing circuit (R21) and a data assembly circuit (R22), wherein the pre-output processing circuit (R21) is configured to receive the pre-output data bit (Pdata) and the pre-output sign bit (Psign) to generate an output data bit representation (Data_out); and the data assembly circuit (R22) is configured to generate the second type data according to the output data bit representation (Data_out) and the pre-output sign bit Psign, wherein the pre-output processing circuit (R21) is further configured to generate a floating-point number decimal point bit representation (SHIFT_FP), and the data assembly circuit (R22) is configured to generate the second type data according to the output data bit representation (Data_out), the floating-point number decimal point bit representation (Shift_FP), and the pre-output sign bit (Psign).

9. The converter of claim 8, wherein the pre-output processing circuit (R21) includes: a fourth selector and a second complement calculator, wherein the fourth selector is configured to receive the pre-output data bit (Pdata) and the pre-output sign bit (Psign), wherein if the pre-output sign bit (Psign) is a negative number, the fourth selector outputs the pre-output data bit to the second complement calculator, and if the pre-output sign bit (Psign) is a positive number or is not the negative number, the fourth selector outputs the pre-output data bit as the output data bit representation (Data_out); and the second complement calculator is configured to calculate a complement for the pre-output data bit (Pdata), wherein the pre-output processing circuit (R21) further includes: a third selector, a second normalizer, and a floating-point number decimal point location determinator, wherein the third selector is configured to receive the pre-output data bit (Pdata) and judge whether a data type of the pre-output data bit (Pdata) is a first type or a second type, wherein if the data type of the pre-output data bit (Pdata) is the first type, the third selector sends the pre-output data bit (Pdata) to the fourth selector, and if the data type of the pre-output data bit (Pdata) is the second type, the third selector sends the pre-output data bit (Pdata) to the second normalizer;

the second normalizer is configured to normalize the pre-output data bit (Pdata) and output a normalized pre-output data bit (Pdata) as the output data bit representation (Data_out); and the floating-point number decimal point location determinator is configured to determine the floating-point number decimal point bit representation (SHIFT_FP) according to an output of the second normalizer.

10. The converter of claim 2, wherein the second calculation unit (C2) further includes:

a rounding bit calculation circuit (C24) configured to calculate a second intermediate rounding bit (STK) according to the second intermediate data bit (ABS), the second intermediate exponent bit (EXP), and the second intermediate sign bit (Sign).

11. The converter of claim 2, wherein the absolute value calculation circuit (C21) includes:

a second selector configured to judge whether the intermediate data bit (Mdata) is less than 0; and a first complement calculator configured to calculate a complement of the intermediate data bit (Mdata) as the second intermediate data bit (ABS) if the intermediate data bit (Mdata) is less than 0, otherwise, take the intermediate data bit (Mdata) as the second intermediate data bit (ABS).

12. The converter of claim 11, wherein the absolute value calculation circuit (C21) further includes a first selector and a first normalizer, wherein the first selector is configured to judge whether a data type of the intermediate data bit (Mdata) is a first type or a second type;

if the data type of the intermediate data bit (Mdata) is the first type, the first selector selects the second selector for processing;

if the data type of the intermediate data bit (Mdata) is the second type, the first selector selects the first normalizer for processing; and the first normalizer is configured to normalize the intermediate data bit (Mdata) as the second intermediate data bit (ABS) if the data type of the intermediate data bit (Mdata) is the second type.

13. The converter of claim 2, wherein the sign bit calculation circuit (C22) is a straight connection line.

14. The converter of claim 2, wherein the second pre-output parsing unit (P2) includes:

a rounding bit calculation circuit (C24) configured to calculate a second intermediate rounding bit (STK) according to the second intermediate data bit (ABS), the second intermediate exponent bit (EXP), and the second intermediate sign bit (Sign).

15. The converter of claim 1, wherein the first extracting unit (E1) includes: a sign bit calculation circuit (E11), a significant bit calculation circuit (E12), and an intermediate exponent bit calculation circuit (E13), wherein the sign bit calculation circuit (E11) is configured to, from the first type data, extract a sign of the first type data as the intermediate sign bit (Msign);

the significant bit calculation circuit (E12) is configured to, from the first type data, extract a significant data bit of the first type data as the intermediate data bit (Mdata); and the intermediate exponent bit calculation circuit (E13) is configured to, according to the first type data or the first exponent bit, obtain exponent information of the first type data as the intermediate exponent bit (Mshift).

16. The converter of claim 1, further comprising a memory configured to store the intermediate result.

17. A method for data type conversion, comprising:

receiving, by a first conversion stage (L1), first type data and first descriptive information about the first type data, and according to the first descriptive information, converting the first type data into an intermediate result; and receiving, by a second conversion stage (L2), second descriptive information about second type data, and according to the second descriptive information, converting the intermediate result into the second type data, wherein the first conversion stage (L1) includes a first receiving unit (Rx1) and a first extracting unit (E1), and the first descriptive information includes a first data type of the first type data and a first exponent bit of the first type data, wherein the first receiving unit (Rx1) is configured to receive the first type data and the first descriptive information; and the first extracting unit (E1) is configured to, from the first type data and the first descriptive information, extract an intermediate sign bit (Msign), an intermediate data bit (Mdata), and an intermediate exponent bit (Mshift) as the intermediate result, wherein the second conversion stage (L2) includes a second calculation unit (C2), a second pre-output parsing unit (P2), and a second data recovery unit (R2), wherein the second calculation unit (C2) is configured to receive the intermediate result and the second descriptive information, and according to the intermediate result and the second descriptive information, calculate a second intermediate result;

the second pre-output parsing unit (P2) is configured to calculate a pre-output data bit (Pdata) and a pre-output sign bit (Psign) according to the second intermediate result; and the second data recovery unit (R2) is configured to generate the second type data according to the pre-output data bit (Pdata) and the pre-output sign bit (Psign).

* * * * *